(12) United States Patent
Bibl et al.

(10) Patent No.: US 10,964,900 B2
(45) Date of Patent: Mar. 30, 2021

(54) LIGHT EMITTING DIODE DISPLAY WITH REDUNDANCY SCHEME

(71) Applicant: Apple Inc., Cupertino, CA (US)

(72) Inventors: Andreas Bibl, Los Altos, CA (US); Kapil V. Sakariya, Los Altos, CA (US); Charles R. Griggs, San Jose, CA (US); James Michael Perkins, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/529,670

(22) Filed: Aug. 1, 2019

(65) Prior Publication Data

US 2020/0013975 A1    Jan. 9, 2020

Related U.S. Application Data

(63) Continuation of application No. 15/828,069, filed on Nov. 30, 2017, now Pat. No. 10,411,210, which is a
(Continued)

(51) Int. Cl.
*H01L 51/50* (2006.01)
*H01L 23/00* (2006.01)
(Continued)

(52) U.S. Cl.
CPC ............. *H01L 51/50* (2013.01); *G09G 3/006* (2013.01); *H01L 21/6835* (2013.01);
(Continued)

(58) Field of Classification Search
None
See application file for complete search history.

(56) References Cited

U.S. PATENT DOCUMENTS

| 4,755,474 A | 7/1988 | Patton |
| 5,592,358 A | 1/1997 | Shamouilian et al. |

(Continued)

FOREIGN PATENT DOCUMENTS

| CN | 102760408 A | 10/2012 |
| EP | 1554764 B1 | 5/2017 |

(Continued)

OTHER PUBLICATIONS

European Patent Application No. 14769046.5, Extended European Search Report dated Oct. 7, 2016, 8 pages.
(Continued)

*Primary Examiner* — Frederick D Bailey
(74) *Attorney, Agent, or Firm* — Jaffery Watson Mendonsa & Hamilton LLP

(57) ABSTRACT

A display panel and method of manufacture are described. In an embodiment, a display substrate includes a pixel area and a non-pixel area. An array of subpixels and corresponding array of bottom electrodes are in the pixel area. An array of micro LED devices are bonded to the array of bottom electrodes. One or more top electrode layers are formed in electrical contact with the array of micro LED devices. In one embodiment a redundant pair of micro LED devices are bonded to the array of bottom electrodes. In one embodiment, the array of micro LED devices are imaged to detect irregularities.

17 Claims, 30 Drawing Sheets

Related U.S. Application Data continuation of application No. 14/798,298, filed on Jul. 13, 2015, now Pat. No. 9,865,832, which is a continuation of application No. 13/842,925, filed on Mar. 15, 2013, now Pat. No. 9,252,375.

(51) Int. Cl.
  *H01L 21/683* (2006.01)
  *G09G 3/00* (2006.01)
  *H01L 27/15* (2006.01)
  *H01L 27/12* (2006.01)
  *G09G 3/3208* (2016.01)

(52) U.S. Cl.
  CPC .............. *H01L 24/24* (2013.01); *H01L 24/75* (2013.01); *H01L 24/82* (2013.01); *H01L 24/83* (2013.01); *H01L 24/97* (2013.01); *H01L 27/156* (2013.01); *G09G 3/3208* (2013.01); *H01L 24/32* (2013.01); *H01L 27/1214* (2013.01); *H01L 2221/68368* (2013.01); *H01L 2221/68381* (2013.01); *H01L 2224/2401* (2013.01); *H01L 2224/245* (2013.01); *H01L 2224/2405* (2013.01); *H01L 2224/24011* (2013.01); *H01L 2224/24137* (2013.01); *H01L 2224/24227* (2013.01); *H01L 2224/29005* (2013.01); *H01L 2224/29109* (2013.01); *H01L 2224/29111* (2013.01); *H01L 2224/29113* (2013.01); *H01L 2224/29118* (2013.01); *H01L 2224/29124* (2013.01); *H01L 2224/29139* (2013.01); *H01L 2224/29144* (2013.01); *H01L 2224/29147* (2013.01); *H01L 2224/29155* (2013.01); *H01L 2224/32014* (2013.01); *H01L 2224/32057* (2013.01); *H01L 2224/32237* (2013.01); *H01L 2224/32503* (2013.01); *H01L 2224/759* (2013.01); *H01L 2224/7565* (2013.01); *H01L 2224/7598* (2013.01); *H01L 2224/75252* (2013.01); *H01L 2224/75301* (2013.01); *H01L 2224/75725* (2013.01); *H01L 2224/82101* (2013.01); *H01L 2224/82102* (2013.01); *H01L 2224/82104* (2013.01); *H01L 2224/83* (2013.01); *H01L 2224/83005* (2013.01); *H01L 2224/8381* (2013.01); *H01L 2224/8383* (2013.01); *H01L 2224/83192* (2013.01); *H01L 2224/83193* (2013.01); *H01L 2224/83203* (2013.01); *H01L 2224/83805* (2013.01); *H01L 2224/83825* (2013.01); *H01L 2224/97* (2013.01); *H01L 2924/0781* (2013.01); *H01L 2924/12041* (2013.01); *H01L 2924/12042* (2013.01); *H01L 2924/12044* (2013.01)

(56) References Cited

U.S. PATENT DOCUMENTS

| | | |
|---|---|---|
| 5,839,187 A | 11/1998 | Sato et al. |
| 5,851,664 A | 12/1998 | Bennett et al. |
| 5,888,847 A | 3/1999 | Rostoker et al. |
| 5,903,428 A | 5/1999 | Grimard et al. |
| 5,996,218 A | 12/1999 | Shamouilian et al. |
| 6,071,795 A | 6/2000 | Cheung et al. |
| 6,091,085 A | 7/2000 | Lester |
| 6,335,263 B1 | 1/2002 | Cheung et al. |
| 6,403,985 B1 | 6/2002 | Fan et al. |
| 6,420,242 B1 | 7/2002 | Cheung et al. |
| 6,514,779 B1 | 2/2003 | Ryu et al. |
| 6,521,511 B1 | 2/2003 | Inoue et al. |
| 6,558,109 B2 | 5/2003 | Gibbel |
| 6,613,610 B2 | 9/2003 | Iwafuchi et al. |
| 6,629,553 B2 | 10/2003 | Odashima et al. |
| 6,670,038 B2 | 12/2003 | Sun et al. |
| 6,786,390 B2 | 9/2004 | Yang et al. |
| 6,878,607 B2 | 4/2005 | Inoue et al. |
| 6,911,666 B2 | 6/2005 | Voutsas |
| 7,033,842 B2 | 4/2006 | Haji et al. |
| 7,148,127 B2 | 12/2006 | Oohata et al. |
| 7,160,633 B2 | 1/2007 | Tai et al. |
| 7,208,337 B2 | 4/2007 | Eisert et al. |
| 7,353,596 B2 | 4/2008 | Shida et al. |
| 7,358,158 B2 | 4/2008 | Aihara et al. |
| 7,482,696 B2 | 1/2009 | Shei et al. |
| 7,541,568 B2 | 6/2009 | Chou |
| 7,585,703 B2 | 9/2009 | Matsumura et al. |
| 7,642,710 B2 | 1/2010 | Yao et al. |
| 7,723,764 B2 | 5/2010 | Oohata et al. |
| 7,795,629 B2 | 9/2010 | Watanabe et al. |
| 7,795,804 B2 | 9/2010 | Kim |
| 7,797,820 B2 | 9/2010 | Shida et al. |
| 7,838,410 B2 | 11/2010 | Hirao et al. |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,906,787 B2 | 3/2011 | Kang |
| 7,910,945 B2 | 3/2011 | Donofrio et al. |
| 7,927,976 B2 | 4/2011 | Menard |
| 7,928,465 B2 | 4/2011 | Lee et al. |
| 7,972,875 B2 | 7/2011 | Rogers et al. |
| 7,999,454 B2 | 8/2011 | Winters et al. |
| 8,023,248 B2 | 9/2011 | Yonekura et al. |
| 8,049,410 B2 | 11/2011 | Suh et al. |
| 8,333,860 B1 | 12/2012 | Bibi et al. |
| 8,349,116 B1 | 1/2013 | Bibi et al. |
| 2001/0029088 A1 | 10/2001 | Odajima et al. |
| 2002/0036471 A1 | 3/2002 | Silvestre |
| 2002/0076848 A1 | 6/2002 | Spooner et al. |
| 2002/0113246 A1 | 8/2002 | Nagai |
| 2003/0010975 A1 | 1/2003 | Gibb et al. |
| 2003/0017360 A1 | 1/2003 | Tai et al. |
| 2003/0094615 A1 | 5/2003 | Yamazaki et al. |
| 2003/0177633 A1 | 9/2003 | Haji et al. |
| 2003/0222263 A1 | 12/2003 | Choi |
| 2004/0027532 A1 | 2/2004 | Kim |
| 2004/0125032 A1 | 7/2004 | Ikuta et al. |
| 2004/0227704 A1 | 11/2004 | Wang et al. |
| 2005/0078104 A1 | 4/2005 | Matthies et al. |
| 2005/0104530 A1 | 5/2005 | Chung et al. |
| 2005/0176190 A1 | 8/2005 | Tomoda et al. |
| 2005/0243039 A1 | 11/2005 | Kwak |
| 2005/0269962 A1 | 12/2005 | Matsunaga |
| 2005/0274959 A1 | 12/2005 | Kim et al. |
| 2006/0091406 A1 | 5/2006 | Kaneko et al. |
| 2006/0092276 A1 | 5/2006 | Ariglio et al. |
| 2006/0103320 A1 | 5/2006 | Janning |
| 2006/0154390 A1 | 7/2006 | Tran et al. |
| 2006/0160276 A1 | 7/2006 | Brown et al. |
| 2006/0214299 A1 | 9/2006 | Fairchild et al. |
| 2006/0238463 A1 | 10/2006 | Kim et al. |
| 2007/0063644 A1 | 3/2007 | Kim |
| 2007/0166851 A1 | 7/2007 | Tran et al. |
| 2007/0194330 A1 | 8/2007 | Ibbetson et al. |
| 2008/0062096 A1 | 3/2008 | Yamashita et al. |
| 2008/0163481 A1 | 7/2008 | Shida et al. |
| 2009/0068774 A1 | 3/2009 | Slater et al. |
| 2009/0102753 A1 | 4/2009 | Yamashita et al. |
| 2009/0146303 A1 | 6/2009 | Kwon |
| 2009/0206362 A1* | 8/2009 | Sung .................. H01L 33/0079 257/103 |
| 2009/0284501 A1 | 11/2009 | Nathan et al. |
| 2009/0303713 A1 | 12/2009 | Chana et al. |
| 2009/0314991 A1 | 12/2009 | Cho et al. |
| 2010/0045937 A1 | 2/2010 | Li |
| 2010/0051910 A1 | 3/2010 | Choi |
| 2010/0188794 A1 | 7/2010 | Park et al. |
| 2010/0203661 A1 | 8/2010 | Hodota |
| 2010/0248484 A1 | 9/2010 | Bower et al. |
| 2010/0270567 A1 | 10/2010 | Emerson et al. |
| 2010/0276726 A1 | 11/2010 | Cho et al. |
| 2010/0309100 A1 | 12/2010 | Cok et al. |

(56) References Cited

U.S. PATENT DOCUMENTS

| | | |
|---|---|---|
| 2011/0003410 A1 | 1/2011 | Tsay et al. |
| 2011/0151602 A1 | 6/2011 | Speier |
| 2011/0242836 A1 | 10/2011 | Li |
| 2011/0261563 A1 | 10/2011 | Li |
| 2012/0064642 A1 | 3/2012 | Huang et al. |
| 2012/0092389 A1 | 4/2012 | Okuyama |
| 2012/0134065 A1 | 5/2012 | Furuya et al. |
| 2012/0218318 A1 | 8/2012 | Hirao et al. |
| 2012/0223875 A1 | 9/2012 | Lau et al. |
| 2012/0256814 A1 | 10/2012 | Ootorii et al. |
| 2012/0305942 A1* | 12/2012 | Lo .................. H01L 33/007 257/77 |
| 2013/0083559 A1 | 4/2013 | Oh |
| 2013/0126081 A1 | 5/2013 | Hu et al. |
| 2013/0126891 A1 | 5/2013 | Bibi et al. |
| 2013/0210194 A1 | 8/2013 | Bibi et al. |
| 2013/0285086 A1 | 10/2013 | Hu et al. |
| 2013/0313605 A1 | 11/2013 | Chou et al. |
| 2014/0084482 A1 | 3/2014 | Hu et al. |
| 2014/0124802 A1 | 5/2014 | Do et al. |
| 2015/0354769 A1 | 12/2015 | Moyer |

FOREIGN PATENT DOCUMENTS

| | | | |
|---|---|---|---|
| JP | 05291624 A | | 11/1993 |
| JP | 3406207 | | 5/1999 |
| JP | 2000195677 A | | 7/2000 |
| JP | 2005085737 A | | 3/2005 |
| JP | 2005509290 A | | 4/2005 |
| JP | 2008065200 A | | 3/2008 |
| JP | 2009122652 A | | 6/2009 |
| JP | 2012089572 A | | 5/2012 |
| JP | 2012227514 A | | 11/2012 |
| WO | 03012884 A1 | | 2/2003 |
| WO | 2003041157 A2 | | 5/2003 |
| WO | 2003052825 A1 | | 6/2003 |
| WO | 2005020344 A1 | | 3/2005 |
| WO | 2011123285 | | 10/2011 |
| WO | 2012148234 A2 | | 11/2012 |

OTHER PUBLICATIONS

PCT International Preliminary Report on Patentability for International Application No. PCT/US2014/021259 dated Sep. 24, 2015, 13 pages.

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.

Bower, CA, et al., "Active-Matrix OLEO Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laboratory, 2000, pp. 51-53 accessed at http://www.socnb.com/report/ptech _e/2000p5 • 1_e.pdf.

Geffroy, et al., "Organic light-emitting diode (OLEO) technology: materials, devices and display technologies," 2006 Society of Chemical Industry, pp. 572-582.

Gohda, et al., "58.3: A 3.6-in. 202-ppi Full-Color AMPLED Display Fabricated by Ink-Jet Method," 2006 SID Digest, pp. '1767-1770.

Guerre, Roland, et al, "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. Of ASID '06, 8-12, Oct., New Delhi, pp. 53-58.

Harris, Jonathan H., "Sintered Aluminum Nitride Ceramics for High-Power Electronic Applications" Journal of the Minerals, Metals and Materials Society, vol. 50, No. 6, Jun. 1998, p. 56.

Hekmatshoar, et al., "A novel TFT-OLED integration for OLED—independent pixel programming in amorphous-Si AMOLED pixels," 2008, Society for Information Display, Journal of the SID 16/1, pp. 183-188.

Horwitz, Chris M., "Electrostatic Chucks: Frequently Asked Questions" Electrogrip, 2006, 10 pgs, accessed at www.electrogrip.com.

Hossick-Schott, Joachim, "Prospects for the ultimate energy density of oxide-based capacitor anodes" Medtronic Energy and Components Center, -10 pgs.

Kipman, Yair, "Dot placement Analysis Using a Line Scan Camera and Rigid Body Rotation," ImageXpert Inc., Nashua, NH, USA, 4 pgs., [n.d.], PDF metadata indicates document creation date May 10, 2004.

Lee, San Youl, et al., "Wafer-level fabrication of GAN-based vertical light-emitting diodes using a multi-functional bonding material system" Semicond. Sci. Technol. 24, 2009, 4 pgs.

"Major Research Thrust: Epitaxial Layer Transfer by Laser Lift-off" Purdue University, Heterogeneous Integration Research Group, accessed at https://engineering.purdue.edu/HetInt/project_epitaxial_layer_transieUlo.htm, last updated Aug. 2003.

"Line Scan Imaging Basics-Application Note," DALSA-Technology with vision, 11 pgs., [n.d.], PDF metadata indicates document creation date Jan. 21, 2003.

Mei, Zequn, et al., "Low-Temperature Solders" Hewlett-Packard Journal, Article •10, Aug. 1996, pp. 1-10.

Mercado, Lei, L., et al., "A Mechanical Approach to Overcome RF MEMS Switc?, Stiction Problem" 2003 Electronic Components and Technology Conference, pp. 377-384.

Miskys, Claudio R., et al., "Freestanding GaN-substrates and devices" phys. Stat. sol. © 0, No. 6, 2003, pp. 1627-1650.

Ohara, et al., "4.0-inch Active-Matrix Organic Light-Emitting Diode Display Integrated with Driver Circuits Using Amorphous In-Ga-Zn-Oxide Thin-Film Transistors with Suppressed Variation," 2010 The Japan Society of Applied Physics, pp. 1-6.

PCT International Search Report and Written Opinion for International Application No. PCT/US2014/021259, dated Jun. 16, 2014, 18 pages.

"Principles of Electrostatic Chucks: 1—Techniques for High Performance Grip and Release" ElectroGrip, Principles1 rev3 May 2006, 2 pgs, accessed at www.electrogrip.com.

Sarma, et al., "Active Matrix OLED Using 150° C a-Si TFT Backplane Built on Flexible Plastic Substrate," SPIE Symp. On Aerospace/Defense Sending, Orlando, FL, Apr. 2003, and to be published in SPIE Proc., vol. 5080, paper 24 (2003), 12 pgs.

Steigerwald, Daniel, et al., "III-V Nitride Semiconductors for High-Performance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.

Widas, Robert, "Electrostatic Substrate Clamping For Next Generation Semiconductor Devices" Apr. 21, 1999, 4 pgs.

\* cited by examiner

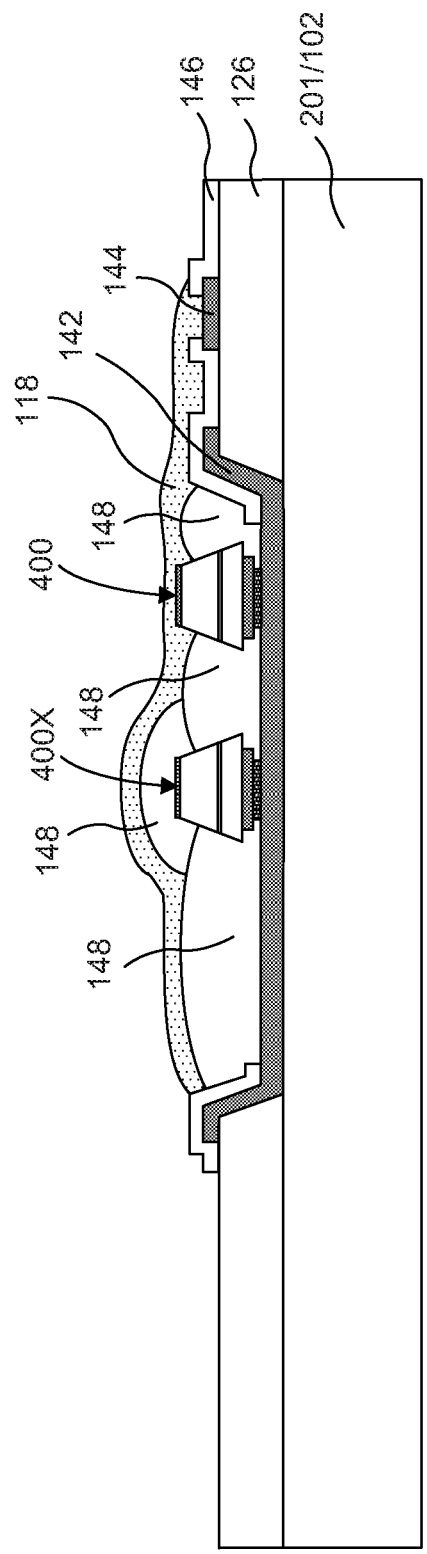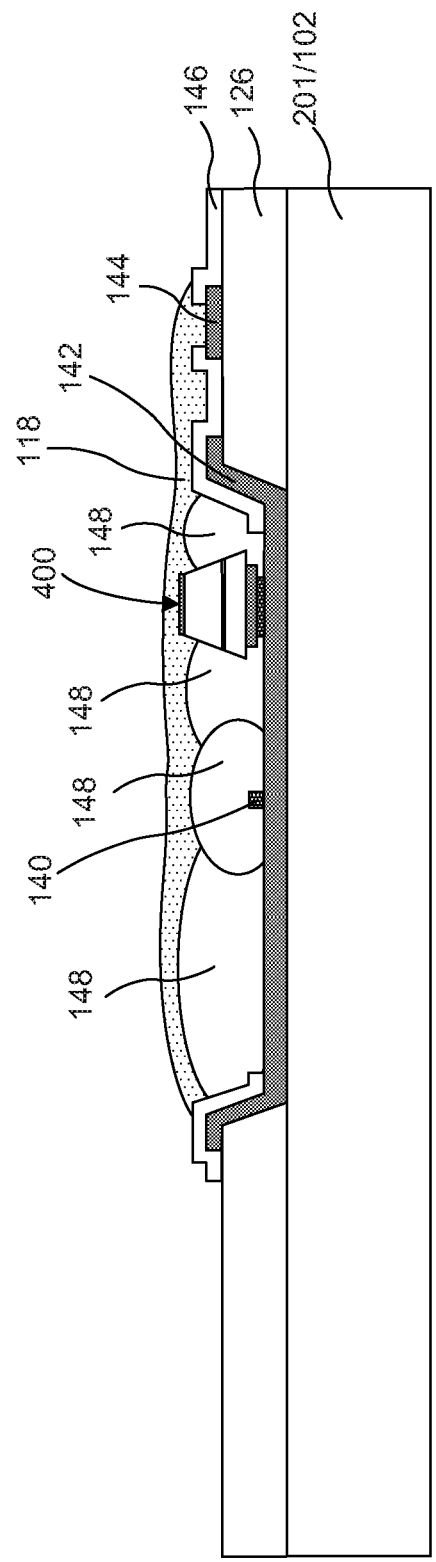
FIG. 9
FIG. 10

LIGHT EMITTING DIODE DISPLAY WITH REDUNDANCY SCHEME

RELATED APPLICATIONS

This application is a continuation of U.S. patent application Ser. No. 15/828,069, filed Nov. 30, 2017, which is a continuation of U.S. patent application Ser. No. 14/798,298, filed on Jul. 13, 2015, now U.S. Pat. No. 9,865,832, which is a continuation of U.S. patent application Ser. No. 13/842,925, filed on Mar. 15, 2013, now U.S. Pat. No. 9,252,375, which is related to U.S. patent application Ser. No. 13/842,879, filed Mar. 15, 2013, now U.S. Pat. No. 8,791,474. The full disclosure of U.S. patent application Ser. No. 13/842,925 is incorporated herein by reference.

BACKGROUND

Field

Embodiments of the present invention relate to display systems. More particularly embodiments of the present invention relate to display systems incorporating micro light emitting diodes.

Background Information

Flat panel displays are gaining popularity in a wide range of electronic devices. Common types of flat panel displays include active matrix displays and passive matrix displays. Each pixel in an active matrix display panel is driven by active driving circuitry, while each pixel in a passive matrix display panel does not use such driving circuitry. High-resolution color display panels, such as modern computer displays, smart phones and televisions typically use an active matrix display panel structure for better image quality.

One kind of display panel that is finding commercial application is an active matrix organic light emitting diode (AMOLED) display panel. FIG. 1 is a top view illustration of a top emission AMOLED display panel. FIG. 2 is a cross-sectional side view illustration of FIG. 1 taken along line X-X in the pixel area 104 and line Y-Y crossing the ground ring 116 in the non-pixel area which is any area on the substrate 102 not within the pixel area 104. The AMOLED display panel 100 illustrated in FIGS. 1-2 generally includes a thin film transistor (TFT) substrate 102 supporting a pixel area 104 and non-pixel area outside of the pixel area 104. A TFT substrate 102 is also referred to as a backplane. A TFT substrate which has been further processed to additionally include the pixel area and non-pixel area is also often referred to as a backplane. Two primary TFT substrate technologies used in AMOLEDs include polycrystalline silicon (poly-Si) and amorphous silicon (a-Si). These technologies offer the potential for fabricating the active matrix backplanes at low temperatures (below 200° C.) directly onto flexible plastic substrates for producing flexible AMOLED displays. The pixel area 104 generally includes pixels 106 and subpixels 108 arranged in a matrix, and a set of TFTs and capacitors connected to each subpixel for driving and switching the subpixels. The non-pixel area generally includes a data driver circuit 110 connected to a data line of each subpixel to enable data signals (Vdata) to be transmitted to the subpixels, a scan driver circuit 112 connected to scan lines of the subpixels to enable scan signals (Vscan) to be transmitted to the subpixels, a power supply line 114 to transmit a power signal (Vdd) to the TFTs, and a ground ring 116 to transmit a ground signal (Vss) to the array of subpixels. As shown, the data driver circuit, scan driver circuit, power supply line, and ground ring are all connected to a flexible circuit board (FCB) 113 which includes a power source for supplying power to the power supply line 114 and a power source ground line electrically connected to the ground ring 116.

In the exemplary AMOLED backplane configuration an organic thin film 120 and top electrode 118 are deposited over every subpixel 108 in the pixel area 104. The organic thin film 120 may include multiple layers such as a hole injection layer, hole transport layer, light emitting layer, electron transport layer, and electron injection layer. The multiple layers of the organic thin film 120 are typically formed over the entire pixel area 104, however, the light emitting layer is often deposited with aid of a shadow mask only within the subpixel openings 127 and on the bottom electrode layer 124 corresponding to the emission area for the array of subpixels 108. A top electrode layer 118 is then deposited over the organic thin film within both the pixel area 104 and also within the non-pixel area so that the top electrode 118 layer overlaps the ground ring 116 in the in order to transfer the ground signal to the array of subpixels. In this manner, each of the subpixels 108 can be individually addressed with the corresponding underlying TFT circuitry while a uniform ground signal is supplied to the top of the pixel area 104.

In the particular implementation illustrated, the TFT substrate 102 includes a switching transistor T1 connected to a data line 111 from the data driver circuit 110 and a driving transistor T2 connected to a power line 115 connected to the power supply line 114. The gate of the switching transistor T1 may also be connected to a scan line (not illustrated) from the scan driver circuit 112. A planarization layer 122 is formed over the TFT substrate, and openings are formed to expose the TFT working circuitry. As illustrated, a bottom electrode layer 124 is formed on the planarization layer in electrical connection with the TFT circuitry. Following the formation of the electrode layer a pixel defining layer 125 is formed including an array of subpixel openings 127 corresponding to the emission area for the array of subpixels 108, followed by deposition of the organic layer 120 and top electrode layer 118 over the patterned pixel defining layer, and within subpixel openings 127 of the patterned pixel defining layer 125. The top electrode layer 118 additionally is formed in the non-pixel area and in electrical connection with the ground ring 116.

The planarization layer 122 may function to prevent (or protect) the organic layer 120 and the bottom electrode layer 124 from shorting due to a step difference. Exemplary planarization layer 122 materials include benzocyclobutene (BCB) and acrylic. The pixel defining layer 125 can be formed of a material such as polyimide. The bottom electrode 124 is commonly formed on indium tin oxide (ITO), ITO/Ag, ITO/Ag/ITO, ITO/Ag/indium zinc oxide (IZO), or ITO/Ag alloy/ITO. The top electrode layer 118 is formed of a transparent material such as ITO for top emission.

While AMOLED display panels generally consume less power than liquid crystal display (LCD) panels, an AMOLED display panel can still be the dominant power consumer in battery-operated devices. To extend battery life, it is necessary to reduce the power consumption of the display panel.

SUMMARY OF THE INVENTION

A display panel with redundancy scheme and method of manufacture are described. In an embodiment, a display panel includes a display substrate with a pixel area and a non-pixel area. The pixel area includes an array of subpixels and a corresponding array of bottom electrodes within the array of subpixels. An array of micro LED devices pairs are bonded to the array of bottom electrodes, and one or more top electrodes are formed in electrical contact with the array of micro LED device pairs. The micro LED devices may be formed of a semiconductor material, and may have a maximum width of 1 to 100 μm.

In one application, the display substrate can be a TFT substrate. A ground line may be formed in the non-pixel area of the TFT substrate, and the one or more of the top electrode layers are electrically connected to the ground line. In one embodiment, a first to electrode layer electrically connects a first micro LED device of a micro LED device pair to the ground line, and a separate second top electrode layer electrically connects a second micro LED device of the micro LED device pair to the ground line.

In one application, an array of micro controller chips are bonded to the display substrate, with each bottom electrode electrically connected to a micro controller chip. Each micro controller chip can be connected to a scan driver circuit and a data driver circuit. A ground line may run in the non-pixel area of the display substrate, and the one or more of the top electrode layers are electrically connected to the ground line. In one embodiment, a first top electrode layer electrically connects a first micro LED device of a micro LED device pair to the ground line, and a separate second top electrode layer electrically connects a second micro LED device of the micro LED device pair to the ground line.

In an embedment, a plurality of micro LED device irregularities are within the array of micro LED device pairs. For example, the irregularities can be missing micro LED devices, defective micro LED devices, and contaminated micro LED devices. A passivation layer material can be used to cover the plurality of irregularities, and to electrically insulate the plurality of irregularities. The passivation layer material may also be used to cover sidewalls (e.g. including a quantum well structure) of the array of micro LED device pairs. In one embodiment the one or more top electrode layers do not make electrical contact with the plurality of irregularities, even where the one or more tope electrode layers are formed directly over the plurality of irregularities. The one or more top electrode layers may also be formed elsewhere, or formed around the plurality of irregularities so that they are not formed directly over the plurality of irregularities. In an embodiment, a repair micro LED device is bonded to one of the bottom electrodes including one of the micro LED device irregularities.

In an embodiment, a method of forming a display panel includes an integrated test to detect irregularities in the array of micro LED devices. An array of micro LED devices can be electrostatically transferred from one or more carrier substrates to a corresponding array of bottom electrodes within a corresponding array of subpixels on a display substrate. The surface of the display substrate is then imaged to detect irregularities in the array of micro LED devices, and a passivation layer material is then formed over a plurality of detected irregularities to electrically insulate the plurality of irregularities. One or more top electrode layers can then be formed in electrical contact with the array of micro LED devices without making electrical contact with the plurality of irregularities. In some embodiment, the passivation layer material is formed over the plurality of irregularities by ink jet printing or screen printing, and the one or more top electrode layers are formed by ink jet printing or screen printing. In an embodiment, the one or more top electrode layers are separate top electrode layers. In another embodiment, one of the separate top electrode layers is scribed to cut off an electrical path to a ground line.

Imaging the surface of the display substrate may be performed with a camera. In an embodiment, an image produced from the camera is used to detect irregularities such as missing micro LED devices or contaminated micro LED devices. In an embodiment, imaging includes illuminating the surface of the display substrate with a light source to cause the array of micro LED devices to fluoresce, and imaging the fluorescence of the array of micro LED devices with the camera. An image produced form the camera imaging fluorescence can be used to detect defective micro LED devices.

In an embodiment, a plurality of repair micro LED devices can be transferred to the display substrate adjacent (e.g. on the same bottom electrodes) the plurality of irregularities prior to forming the passivation layer material over the plurality of irregularities. This can then be followed by forming one or more top electrode layers in electrical contact with the array of micro LED devices and the plurality of repair micro LED devices, without making electrical contact with the plurality of irregularities.

In an embodiment a method of forming a display panel with redundancy scheme includes electrostatically transferring an array of micro LED device pairs from one or more carrier substrates to a corresponding array of bottom electrodes within a corresponding array of subpixels on a display substrate. The surface of the display substrate is then imaged to detect irregularities in the array of micro LED device pairs. A passivation layer material may then be formed over a plurality of detected irregularities to electrically insulate the plurality of irregularities. One or more top electrode layers are then formed in electrical contact with the array of micro LED device pairs.

One manner for electrostatic transfer includes electrostatically transferring a first array of micro LED devices from a first area of a first carrier substrate to the display substrate, and electrostatically transferring a second array of micro LED devices from a second area of the first carrier substrate to the display substrate. For example, the first and second areas do not overlap in one embodiment to reduce the probability of correlated defects being transferred to the same subpixel. Another manner for electrostatic transfer includes electrostatically transferring the first and second arrays of micro LED devices from different carrier substrates. In accordance with embodiments of the invention, electrostatic transfer can include electrostatically transferring each micro LED device with a separate electrostatic transfer head.

In an embodiment, imaging the surface of the display surface comprises imaging with a camera. For example, a line scan camera may be used. In an embodiment, an image produced from the camera is used to detect irregularities in the array of micro LED device pairs, such as missing micro LED devices or contaminated micro LED devices. In an embodiment, imaging the surface of the display substrate further includes illuminating the surface of the display substrate with a light source to cause the array of micro LED device pairs to fluoresce, and imaging the fluorescence of the array of micro LED device pairs with the camera to detect defective micro LED devices.

In an embodiment, a single top electrode layer is formed over the array of micro LED device pairs, including the irregularities. The passivation layer material can cover the irregularities so that the top electrode layer is not in electrical contact the irregularities.

In an embodiment, a plurality of separate top electrode layers are formed over the array of micro LED device pairs. The passivation layer material can be used to electrically insulate the irregularities from the top contact layers when formed directly over the irregularities. The top contact layers can also be formed around the irregularities so that they are not directly over the irregularities. Ink jet printing and screen printing may be suitable deposition methods for forming both the passivation layer material, as well as the top electrode layers. In an embodiment, a plurality of repair micro LED devices are transferred to the display substrate adjacent the plurality of irregularities prior to forming the passivation layer material over the plurality of irregularities. The top electrode layers may also be formed over and in electrical contact with the repair micro LED devices.

BRIEF DESCRIPTION OF THE DRAWINGS

FIG. 9 is a cross-sectional side view illustration of an exemplary structure that can be formed after detection of a defective micro LED device in accordance with an embodiment of the invention.

FIG. 10 is a cross-sectional side view illustration of an exemplary structure that can be formed after detection of a missing micro LED device in accordance with an embodiment of the invention.

DETAILED DESCRIPTION OF THE INVENTION

Figure 1:
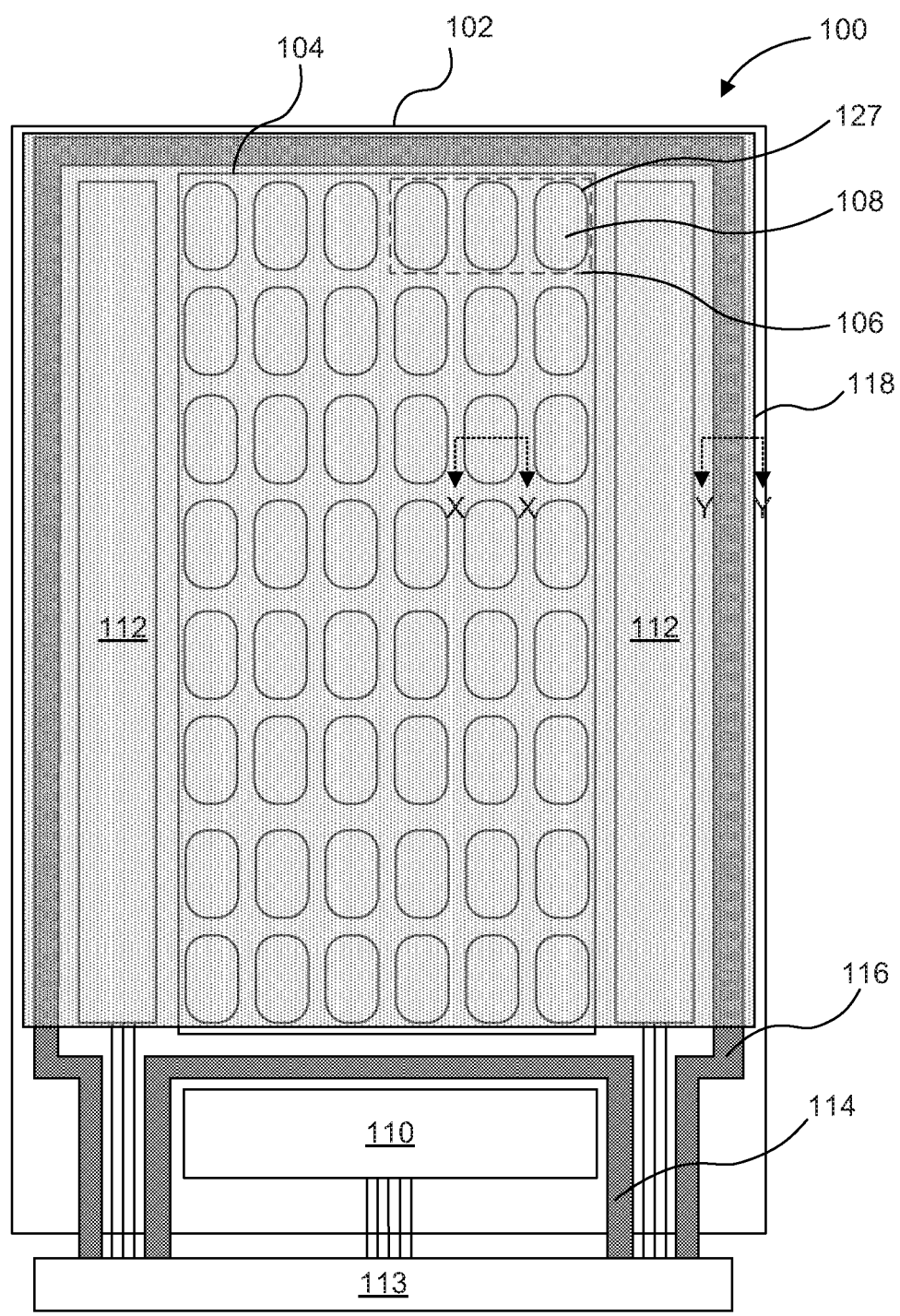
FIG. 1 is a top view illustration of a top emission AMOLED display panel.

Embodiments of the present invention relate to display systems. More particularly embodiments of the present invention relate to a display with a redundancy scheme of light emitting diodes.

In one aspect, embodiments of the invention describe an active matrix display panel including wafer-based emissive micro LED devices. A micro LED device combines the performance, efficiency, and reliability of wafer-based LED devices with the high yield, low cost, mixed materials of thin film electronics used to form AMOLED backplanes. The terms "micro" device or "micro" LED structure as used herein may refer to the descriptive size of certain devices or structures in accordance with embodiments of the invention. As used herein, the terms "micro" devices or structures are meant to refer to the scale of 1 to 100 μm. However, it is to be appreciated that embodiments of the present invention are not necessarily so limited, and that certain aspects of the embodiments may be applicable to larger, and possibly smaller size scales. In an embodiment, a display panel is similar to a typical OLED display panel, with a micro LED device having replaced the organic layer of the OLED display panel in each subpixel. Exemplary micro LED devices which may be utilized with some embodiments of the invention are described in U.S. patent application Ser. No. 13/372,222, U.S. patent application Ser. No. 13/436, 260, U.S. patent application Ser. No. 13/458,932, U.S. patent application Ser. No. 13/711,554, and U.S. patent application Ser. No. 13/749,647 all of which are incorporated herein by reference. The micro LED devices are highly efficient at light emission and consume very little power (e.g., 250 mW for a 10 inch diagonal display) compared to 5-10 watts for a 10 inch diagonal LCD or OLED display, enabling reduction of power consumption of the display panel.

In another aspect, embodiments of the invention describe a redundancy scheme in which a plurality of bonding sites are available for bonding a plurality of micro LED devices on each bottom electrode, for example, within each bank opening for a subpixel. In an embodiment, the redundancy scheme includes at one or more bonding layers (e.g. indium posts) at bonding sites on the bottom electrode within a bank opening, with each bonding layer designed to receive a separate micro LED device. In an embodiment, the redundancy scheme can also include a repair bonding site within the bank opening that is large enough to receive a micro LED device. The repair bonding site may also optionally include a bonding layer. In this manner, in an embodiment, each bank opening may correspond to a single emission color of a subpixel, and receives a plurality of micro LED devices of the emission color. If one of the micro LED devices bonded to one of the bonding layers is defective, then the other micro LED device compensates for the defective micro LED device. In addition, the repair bonding site may be used to bond an additional micro LED device if desired. In this manner, a redundancy and repair configuration is integrated into a backplane structure which can improve emission uniformity across the display panel without having to alter the underlying TFT architecture already incorporated in conventional AMOLED displays.

In another aspect, embodiments of the invention describe an integrated test method for detecting defective, missing, or contaminated micro LED devices after transfer of the micro LED devices from a carrier substrate to display substrate. In this manner, detection of defective, missing, or contaminated micro LED devices can be used to potentially transfer replacement micro LED devices where required, alter subsequent processing involved with passivating the micro LED devices and bottom electrodes, or alter subsequent processing involved with forming the top electrode layers. Furthermore, the integrated test method can be implemented into the fabrication process so that it is not necessary to provide a top electrical contact on the micro LED devices for testing, and a testing can be performed without separate electrical tests.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment" means that a particular feature, structure, configuration, or characteristic described in connection with the embodiment is included in at least one embodiment of the invention. Thus, the appearances of the phrase "in one embodiment" in various places throughout this specification are not necessarily referring to the same embodiment of the invention.

Furthermore, the particular features, structures, configurations, or characteristics may be combined in any suitable manner in one or more embodiments.

The terms "spanning", "over", "to", "between" and "on" as used herein may refer to a relative position of one layer with respect to other layers. One layer "spanning", "over" or "on" another layer or bonded "to" or in "contact" with another layer may be directly in contact with the other layer or may have one or more intervening layers. One layer "between" layers may be directly in contact with the layers or may have one or more intervening layers.

It is to be appreciated that the following description is made specifically with regard to active matrix display panels. However, embodiments are not so limited. In particular, embodiments describing a redundancy scheme, repair site, and testing method for detecting defective, missing, or contaminated micro LED devices can also be implemented into passive matrix display panels, as well as substrates for lighting purposes.

Figure 2:
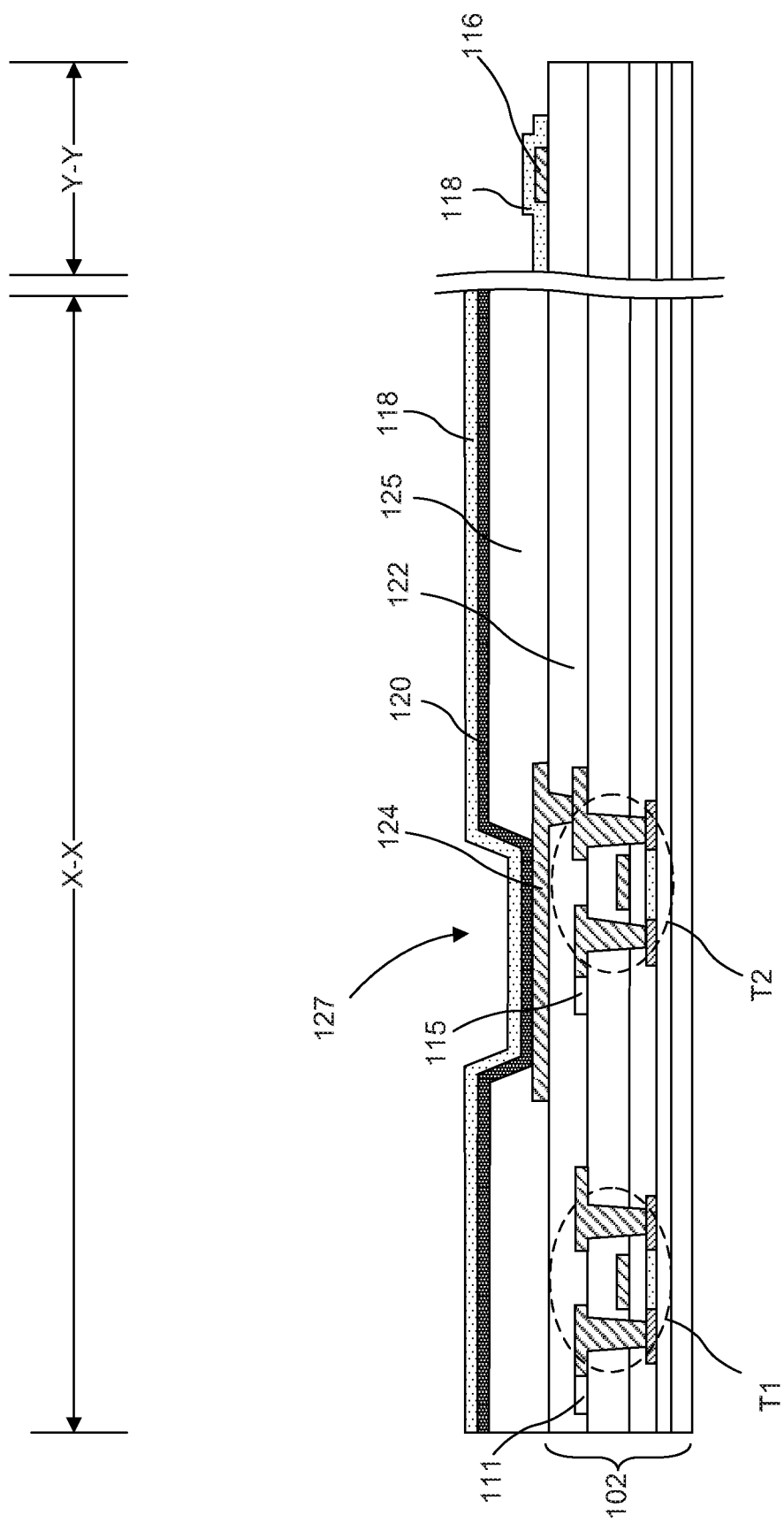
FIG. 2 is a side-view illustration of the top emission AMOLED display panel of FIG. 1 taken along lines X-X and Y-Y.
Figure 3A:
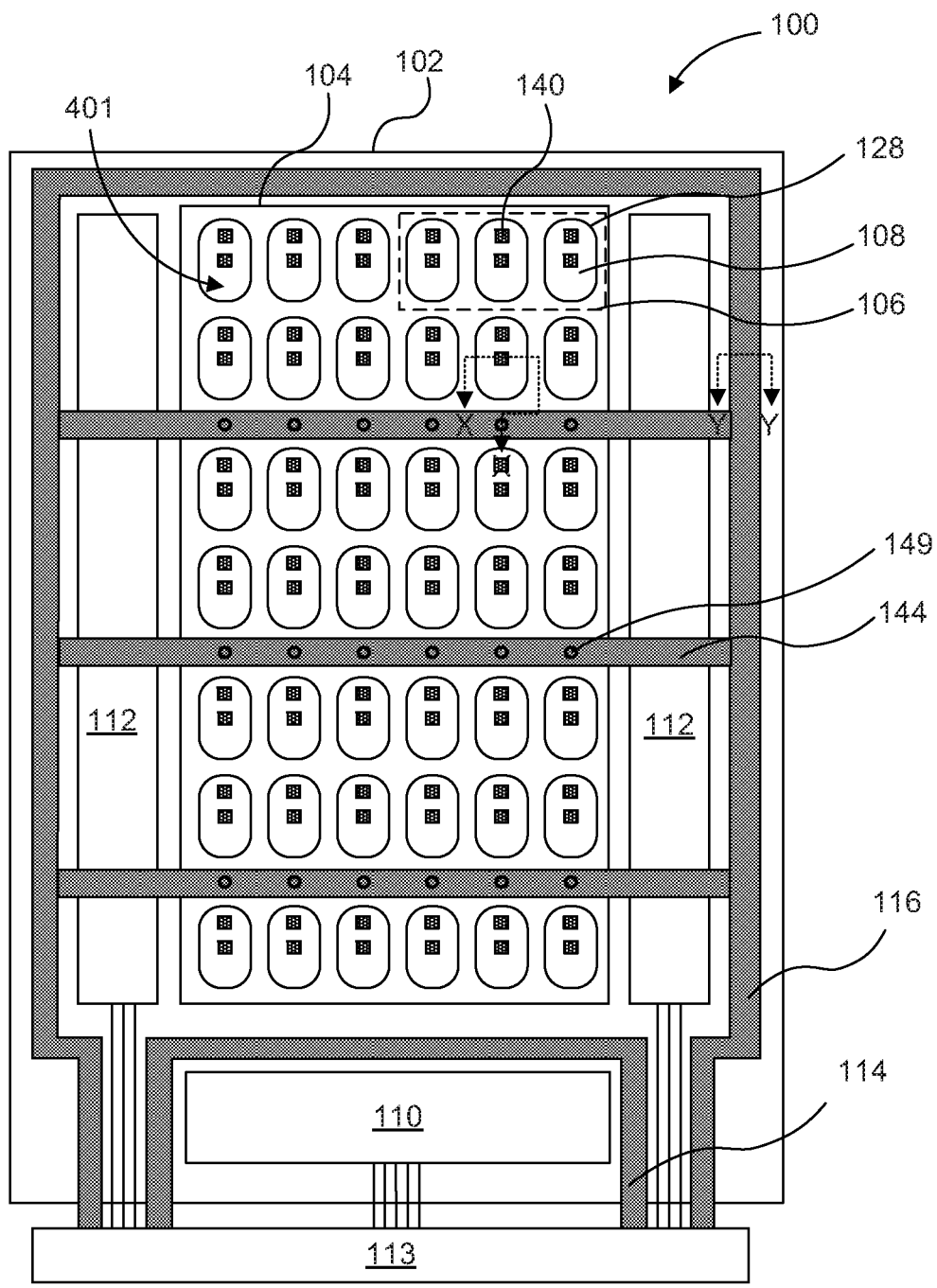
FIG. 3A is a top view illustration of an active matrix display panel in accordance with an embodiment of the invention.
Figure 3B:
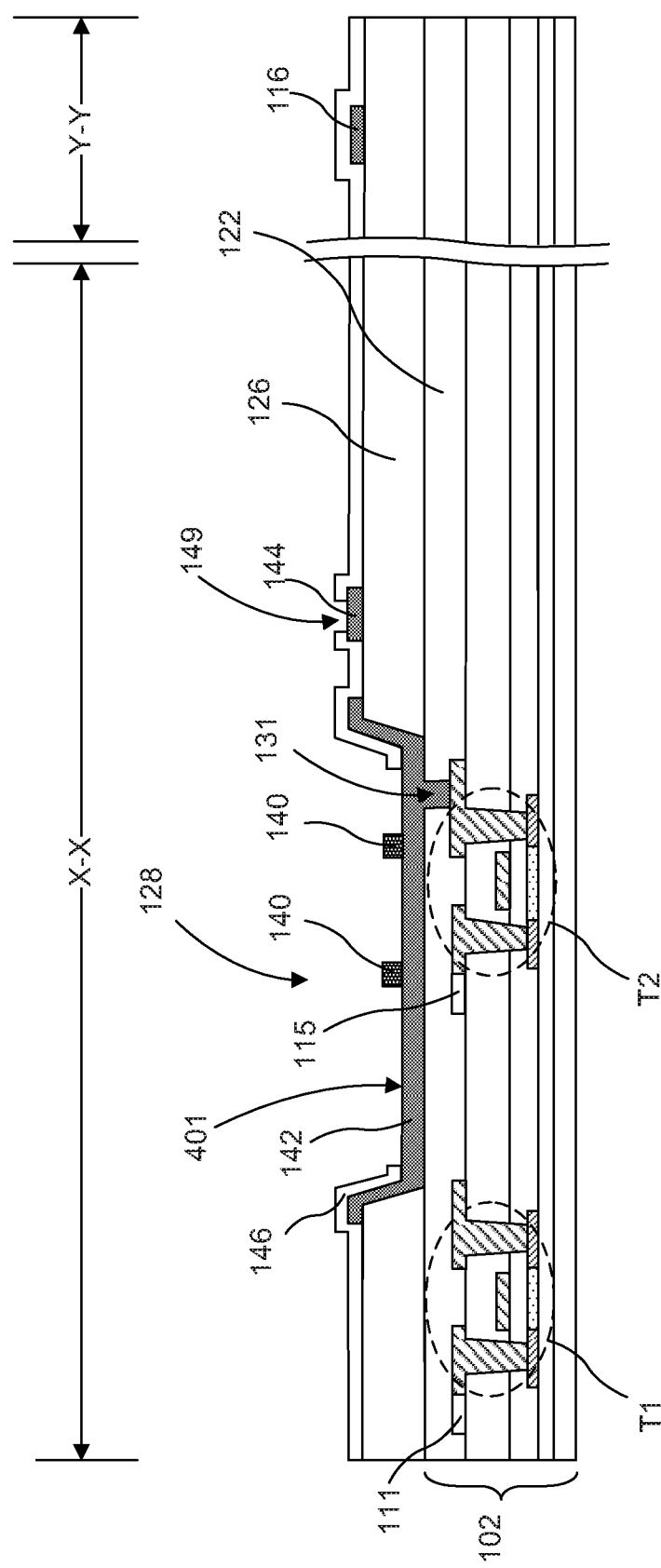
FIG. 3B is a side-view illustration of the active matrix display panel of FIG. 3A taken along lines X-X and Y-Y in accordance with an embodiment of the invention.

Referring now to FIGS. 3A-3B an embodiment is illustrated in which a backplane similar to an AMOLED backplane is modified to receive emissive micro LED devices rather than an organic emission layer. FIG. 3A is a top view illustration of an active matrix display panel in accordance with an embodiment, and FIG. 3B is a side-view illustration of the active matrix display panel of FIG. 3A taken along lines X-X and Y-Y in accordance with an embodiment of the invention. In such an embodiment, the underlying TFT substrate 102 can be similar to those in a typical AMOLED backplane described with regard to FIGS. 1-2 including working circuitry (e.g. T1, T2) and planarization layer 122. Openings 131 may be formed in the planarization layer 122 to contact the working circuitry. The working circuitry can include traditional 2T1C (two transistors, one capacitor) circuits including a switching transistor, a driving transistor, and a storage capacitor. It is to be appreciated that the 2T1C circuitry is meant to be exemplary, and that other types of circuitry or modifications of the traditional 2T1C circuitry are contemplated in accordance with embodiments of the invention. For example, more complicated circuits can be used to compensate for process variations of the driver transistor and the light emitting device, or for their instabilities. Furthermore, while embodiments of the invention are described and illustrated with regard to top gate transistor structures in the TFT substrate 102, embodiments of the invention also contemplate the use of bottom gate transistor structures. Likewise, while embodiments of the invention are described and illustrated with regard to a top emission structure, embodiments of the invention also contemplate the use of bottom, or both top and bottom emission structures. In addition, embodiments of the invention are described and illustrated below specifically with regard to a high side drive configuration including ground tie lines and ground ring. In a high side drive configuration a LED may be on the drain side of a PMOS driver transistor or a source side of an NMOS driver transistor so that the circuit is pushing current through the p-terminal of the LED. Embodiments of the invention are not so limited may also be practiced with a low side drive configuration in which case the ground tie lines and ground ring become the power line in the panel and current is pulled through the n-terminal of the LED.

A patterned bank layer 126 including bank openings 128 is then formed over the planarization layer 122. Bank layer 126 may be formed by a variety of techniques such as ink jet printing, screen printing, lamination, spin coating, CVD, and PVD. Bank layer 126 may be opaque, transparent, or semi-transparent to the visible wavelength. Bank layer 126 may be formed of a variety of insulating materials such as, but not limited to, photo-definable acrylic, photoresist, silicon oxide (SiO$_2$), silicon nitride (SiN$_x$), poly(methyl methacrylate) (PMMA), benzocyclobutene (BCB), polyimide, acrylate, epoxy, and polyester. In an embodiment, bank player is formed of an opaque material such as a black matrix material. Exemplary insulating black matrix materials include organic resins, glass pastes, and resins or pastes including a black pigment, metallic particles such as nickel, aluminum, molybdenum, and alloys thereof, metal oxide particles (e.g. chromium oxide), or metal nitride particles (e.g. chromium nitride).

In accordance with embodiments of the invention, the thickness of the bank layer 126 and width of the bank openings 128 described with regard to the following figures may depend upon the height of the micro LED devices to be mounted within the opening, height of the transfer heads transferring the micro LED devices, and resolution. In an embodiment, the resolution, pixel density, and subpixel density of the display panel may account for the width of the bank openings 128. For an exemplary 55 inch television with a 40 PPI (pixels per inch) and 211 µm subpixel pitch, the width of the bank openings 128 may be anywhere from a few microns to 206 µm to account for an exemplary 5 µm wide surrounding bank structure. For an exemplary display panel with 440 PPI and a 19 µm subpixel pitch, the width of the bank openings 128 may be anywhere from a few microns to 14 µm to account for an exemplary 5 µm wide surrounding bank structure. Width of the bank structure (i.e. between bank openings 128) may be any suitable size, so long as the structure supports the required processes and is scalable to the required PPI.

In accordance with embodiments of the invention, the thickness of the bank layer 126 is not too thick in order for the bank structure to function. Thickness may be determined by the micro LED device height and a predetermined viewing angle. For example, where sidewalls of the bank openings 128 make an angle with the planarization layer 122, shallower angles may correlate to a wider viewing angle of the system. In an embodiment, exemplary thicknesses of the bank layer 126 may be between 1 µm-50 µm.

A patterned conductive layer is then formed over the patterned bank layer 126. Referring to FIG. 3B, in one embodiment the patterned conductive layer includes bottom electrodes 142 formed within the bank openings 128 and in electrical contact with the working circuitry. The patterned conductive layer may also optionally include the ground tie lines 144 and/or the ground ring 116. As used herein the term ground "ring" does not require a circular pattern, or a pattern that completely surrounds an object. Rather, the term ground "ring" means a pattern that at least partially surrounds the pixel area on three sides. In addition, while the following embodiments are described and illustrated with regard to a ground ring 116, it is to be appreciated that embodiments of the invention can also be practiced with a ground line running along one side (e.g. left, right, bottom, top), or two sides (a combination of two of the left, right, bottom, top) of the pixel area. Accordingly, it is to be appreciated that in the following description the reference to and illustration of a ground ring, could potentially be replaced with a ground line where system requirements permit.

The patterned conductive layer may be formed of a number of conductive and reflective materials, and may include more than one layer. In an embodiment, a patterned conductive layer comprises a metallic film such as aluminum, molybdenum, titanium, titanium-tungsten, silver, or gold, or alloys thereof. The patterned conductive layer may include a conductive material such as amorphous silicon, transparent conductive oxides (TCO) such as indium-tin-oxide (ITO) and indium-zinc-oxide (IZO), carbon nanotube film, or a transparent conducting polymer such as poly(3,4-ethylenedioxythiophene) (PEDOT), polyaniline, polyacetylene, polypyrrole, and polythiophene. In an embodiment, the patterned conductive layer includes a stack of a conductive material and a reflective conductive material. In an embodiment, the patterned conductive layer includes a 3-layer stack including top and bottom layers and a reflective middle layer wherein one or both of the top and bottom layers are transparent. In an embodiment, the patterned conductive layer includes a conductive oxide-reflective metal-conductive oxide 3-layer stack. The conductive oxide layers may be transparent. For example, the patterned conductive layer may include an ITO-silver-ITO layer stack. In such a configuration, the top and bottom ITO layers may prevent diffusion and/or oxidation of the reflective metal (silver) layer. In an embodiment, the patterned conductive layer includes a Ti—Al—Ti stack, or a Mo—Al—Mo-ITO stack. In an embodiment, the patterned conductive layer includes a ITO-Ti—Al—Ti-ITO stack. In an embodiment, the patterned conductive layer is 1 µm or less in thickness. The patterned conductive layer may be deposited using a suitable technique such as, but not limited to, PVD.

Following the formation of bottom electrodes 142, ground tie lines 144, and ground ring 116, an insulator layer 146 may then optionally be formed over the TFT substrate 102 covering the sidewalls of the pattered conductive layer. The insulator layer 146 may at least partially cover the bank layer 126 and the reflective layer forming the bottom electrodes 142, ground tie lines 144, and/or ground ring 116. In the embodiment illustrated the insulator layer 146 completely covers the ground ring 116, however, this is optional.

In an embodiment, the insulator layer 146 is formed by blanket deposition using a suitable technique such as lamination, spin coating, CVD, and PVD, and then patterned using a suitable technique such as lithography to form openings exposing the bottom electrodes 142 and openings 149 exposing the ground tie lines 144. In an embodiment, ink jet printing or screen printing may be used to form the insulator layer 146 and openings 149 without requiring lithography. Insulator layer 146 may be formed of a variety of materials such as, but not limited to, SiO$_2$, SiN$_x$, PMMA, BCB, polyimide, acrylate, epoxy, and polyester. For example, the insulator layer 146 may be 0.5 µm thick. The insulator layer 146 may be transparent or semi-transparent where formed over the reflective layer on sidewalls of bottom electrode 142 within the bank openings 128 as to not significantly degrade light emission extraction of the completed system. Thickness of the insulator layer 146 may also be controlled to increase light extraction efficiency, and also to not interfere with the array of transfer heads during transfer of the array of light emitting devices to the reflective bank structure. As will become more apparent in the following description, the patterned insulator layer 146 is optional, and represents one manner for electrically separating conductive layers.

Figure 3C:
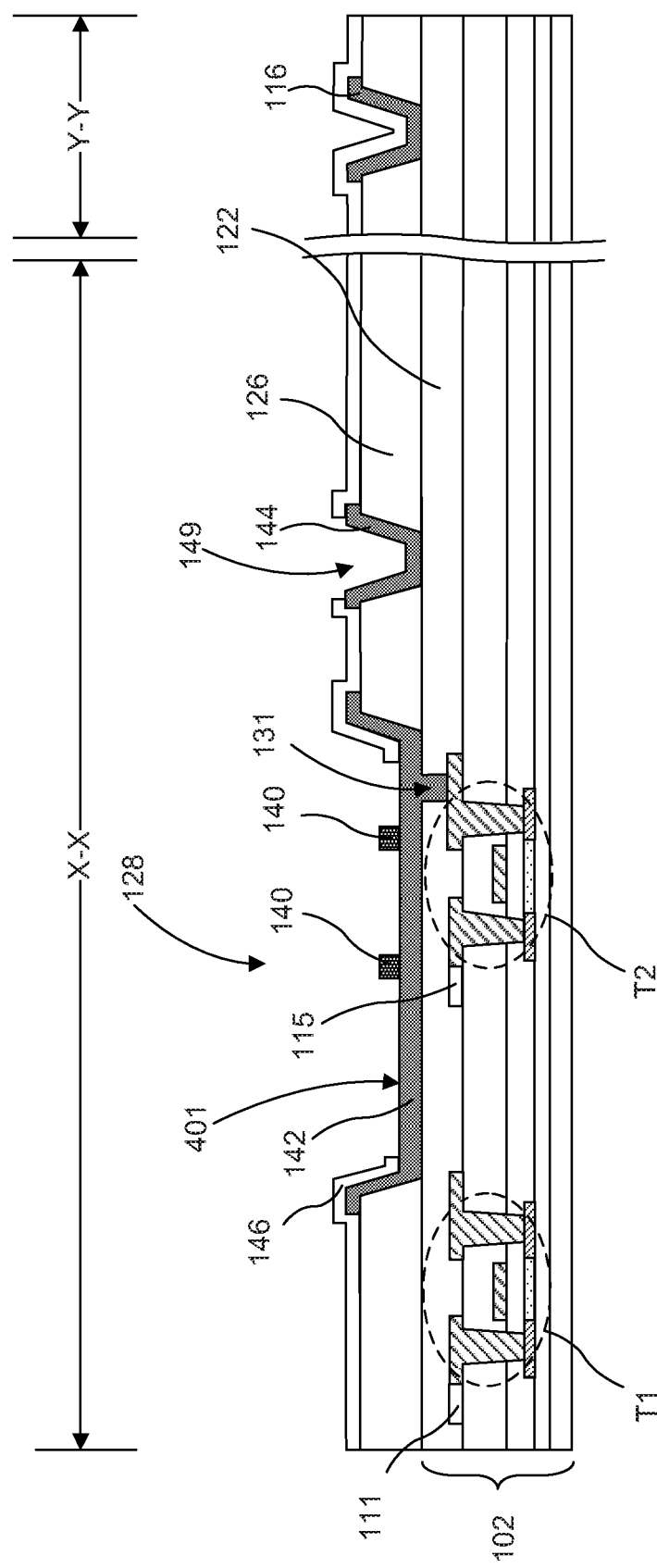
FIG. 3C is a side-view illustration of the active matrix display panel of FIG. 3A taken along lines X-X and Y-Y in accordance with an embodiment of the invention in which ground tie lines and ground ring are formed within a patterned bank layer.
Figure 3D:
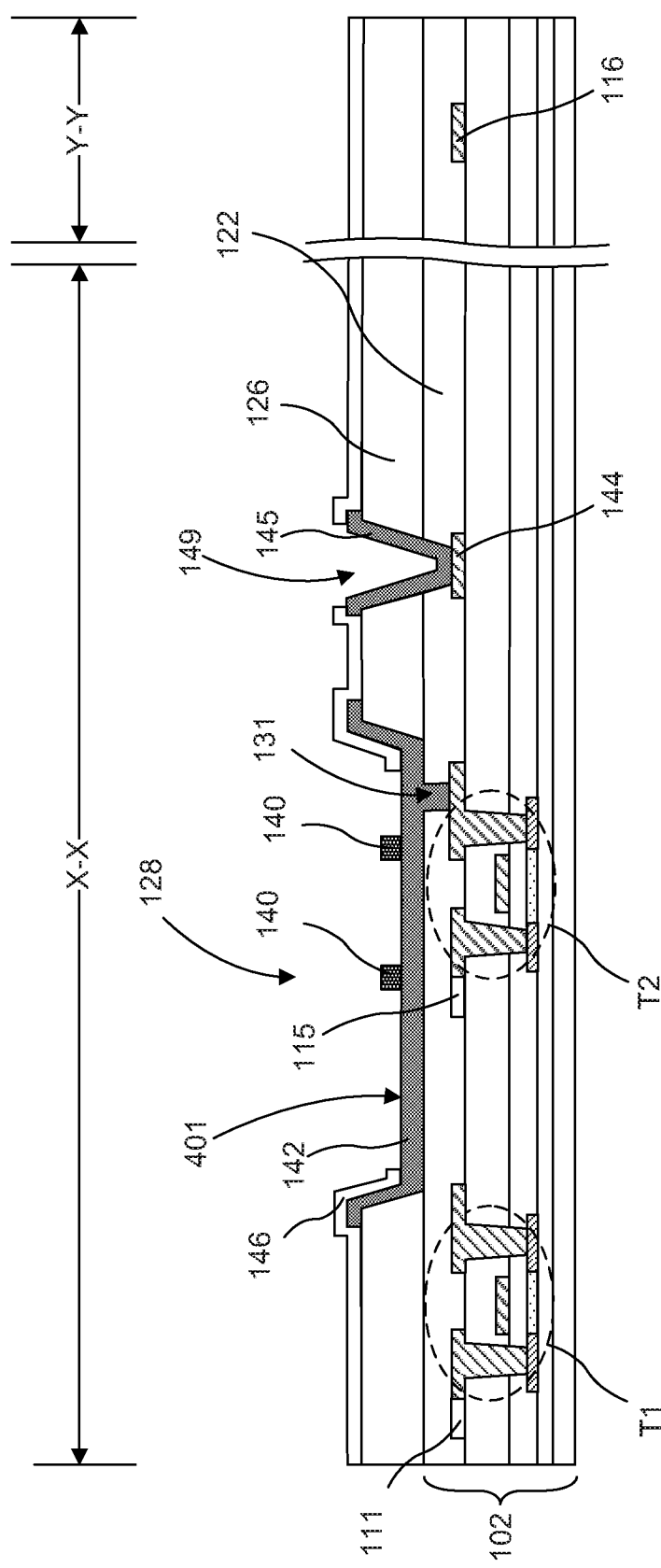
FIG. 3D is a side-view illustration of the active matrix display panel of FIG. 3A taken along lines X-X and Y-Y in accordance with an embodiment of the invention in which ground tie lines and ground ring are formed below a patterned bank layer.

In the embodiment illustrated in FIG. 3B, the bottom electrodes 142, ground tie lines 144, and ground ring 116 can be formed of the same conductive layer. In another embodiment, the ground tie lines 144 and/or ground ring 116 can be formed of a conductive material different from the bottom electrodes 142. For example, ground tie lines 14 and ground ring 116 may be formed with a material having a higher conductivity than the bottom electrodes 142. In another embodiment, ground tie lines 14 and/or ground ring 116 can also be formed within different layers from the bottom electrodes. FIGS. 3C-3D illustrate embodiments where the ground tie lines 144 and ground ring 116 can be formed within or below the patterned bank layer 126. For example, in the embodiment illustrated in FIG. 3C, openings 149, 130 may be formed through the patterned bank layer 126 when forming the ground tie lines 144 and ground ring 116. In the embodiment illustrated in FIG. 3D openings 149 may be formed through the patterned bank layer 126 and planarization layer 122 to contact the ground tie lines 144. In the embodiment, illustrated openings are not formed to expose the ground ring, however, in other embodiments openings could be formed to expose the ground ring. In the embodiment illustrated in FIG. 3D, the ground ring and ground tie lines 144 may have been formed during formation of the working circuitry of the TFT substrate 102. In such an embodiment the conductive layer used to form the bottom electrode 142 may also optionally include via opening layers 145 to further enable electrical contact of the top electrode layer yet to be formed with the ground tie lines 144 through openings 149. Accordingly, it is to be appreciated that the embodiments illustrated in FIGS. 3A-3D are not limiting and that a number of possibilities exist for forming the ground tie lines 144 and ground ring 116, as well as openings 149, 130.

Still referring to embodiments illustrated in FIG. 3A-3D, a plurality of bonding layers 140 may be formed on the bottom electrode layer 142 to facilitate bonding of micro LED devices. In the specific embodiment illustrated two bonding layers 140 are illustrated for bonding two micro LED devices. In an embodiment, the bonding layer 140 is selected for its ability to be inter-diffused with a bonding layer on the micro LED device (yet to be placed) through bonding mechanisms such as eutectic alloy bonding, transient liquid phase bonding, or solid state diffusion bonding as described in U.S. patent application Ser. No. 13/749,647. In an embodiment, the bonding layer 140 has a melting temperature of 250° C. or lower. For example, the bonding layer 140 may include a solder material such as tin (232° C.) or indium (156.7° C.), or alloys thereof. Bonding layer 140 may also be in the shape of a post, having a height greater than width. In accordance with some embodiments of the invention, taller bonding layers 140 may provide an additional degree of freedom for system component leveling, such as planarity of the array of micro LED devices with the TFT substrate during the micro LED device transfer operation and for variations in height of the micro LED devices, due to the change in height of the liquefied bonding layers as they spread out over the surface during bonding, such as during eutectic alloy bonding and transient liquid phase bonding. The width of the bonding layers 140 may be less than a width of a bottom surface of the micro LEDs to prevent wicking of the bonding layers 140 around the sidewalls of the micro LEDs and shorting the quantum well structures.

In addition to bonding layers 140, the embodiments illustrated in FIGS. 3A-3D include a repair bonding site 401 within each bank opening 128 that is large enough to receive a micro LED device. In this manner, the plurality of bonding layers 140 and repair bonding site 401 create a redundancy and repair configuration within each bank opening 128. In the particular embodiments illustrated in FIGS. 3A-3D the repair bonding site 401 is illustrated as being a bare surface on the bottom electrode layer 142. However, embodiments of the invention are not limited to such. In other embodiments, the repair bonding site 401 may also include a bonding layer 140 similarly as the other two bonding layers 140 described and illustrated for the preexisting redundancy scheme. Accordingly, in some embodiments, bonding layers 140 are provided on the bottom electrode layer 142 at the sites of all of the intended micro LED devices in the redundancy scheme, as well as at the repair site 401.

In the embodiments illustrated an arrangement of ground tie lines 144 may run between bank openings 128 in the pixel area 104 of the display panel 100. In addition, a plurality of openings 149 expose the plurality of ground tie lines 144. The number of openings 149 may or may not have a 1:1 correlation to the number of columns (top to bottom) of bank openings 128. For example, in the embodiment illustrated in FIG. 3A, a ground tie opening 149 is formed for each column of bank openings 128, however, this is not required and the number of ground tie openings 149 may be more or less than the number of columns of bank openings 128. Likewise, the number of ground tie lines 144 may or may not have a 1:1 correlation to the number of rows (left to right) of bank openings. For example, in the embodiment illustrated a ground tie line 144 is formed for every two rows of bank openings 128, however, this is not required and the number of ground tie lines 144 may have a 1:1 correlation, or any 1:n correlation to the number (n) of rows of bank openings 128.

While the above embodiments have been described an illustrated with ground tie lines 144 running left and right horizontally across the display panel 100, embodiments are not so limited. In other embodiments, the ground tie lines can run vertically, or both horizontally and vertically to form a grid. A number of possible variations are envisioned in accordance with embodiments of the invention. It has been observed that operation of AMOLED configurations such as those previously illustrated and described with regard to FIGS. 1-2 may result in dimmer emission from the subpixels in the center of the pixel area, where the subpixels are furthest from the ground ring 116, compared to the emission from subpixels at the edges of the pixel area closer to the ground ring 116. In accordance with embodiments of the invention, ground tie lines are formed between the bank openings 128 in the pixel area and are electrically connected to the ground ring 116 or ground line in the non-display area. In this manner, the ground signal may be more uniformly applied to the matrix of subpixels, resulting in more uniform brightness across the display panel 100. In addition, by forming the ground tie lines 144 from a material having better electrical conductivity than the top electrode layer (which is yet to be formed), this may reduce the contact resistance in the electrical ground path.

Figure 4A:
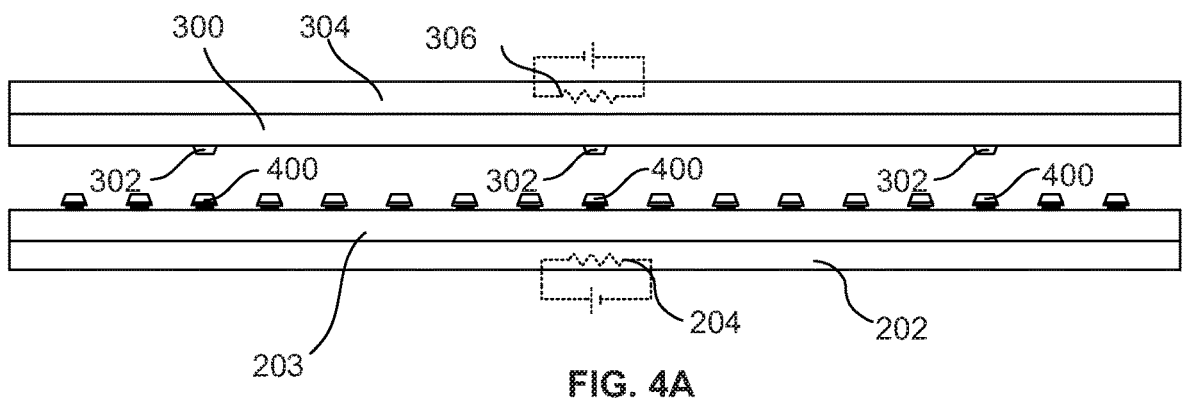
FIGS. 4A-4H are cross-sectional side view illustrations for a method of transferring an array of micro LED devices to a TFT substrate in accordance with an embodiment of the invention.
Figure 4B:
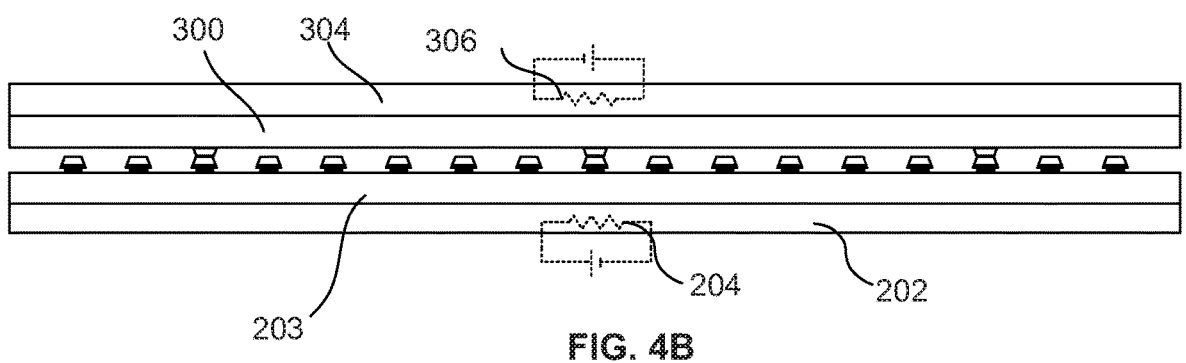
Figure 4C:
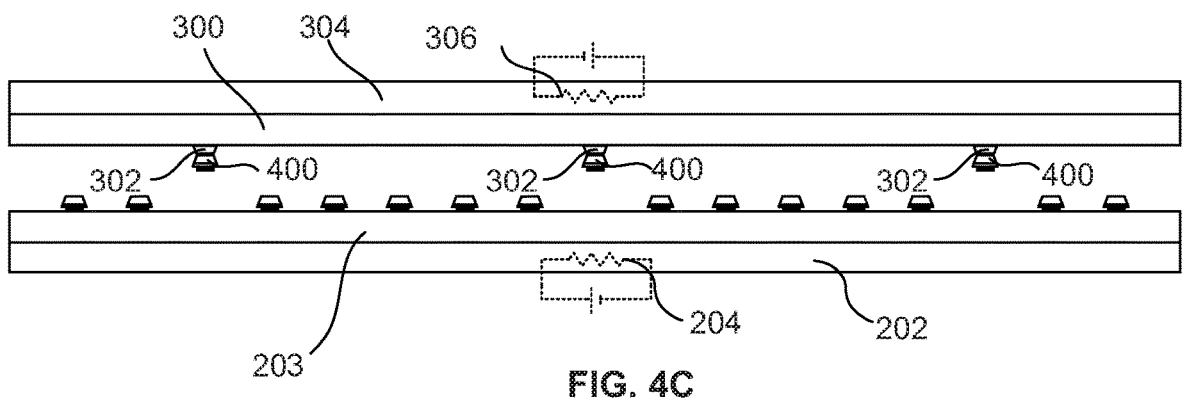

FIGS. 4A-4H are cross-sectional side view illustrations for a method of transferring an array of micro LED devices to the TFT substrate 102 in accordance with an embodiment of the invention. Referring to FIG. 4A, an array of transfer heads 302 supported by a transfer head substrate 300 are positioned over an array of micro LED devices 400 supported on a carrier substrate 203. A heater 306 and heat distribution plate 304 may optionally be attached to the transfer head substrate 300. A heater 204 and heat distribution plate 202 may optionally be attached to the carrier substrate 203. The array of micro LED devices 400 are contacted with the array of transfer heads 302, as illustrated in FIG. 4B, and picked up from the carrier substrate 203 as illustrated in FIG. 4C. In an embodiment, the array of micro LED devices 400 are picked up with an array of transfer heads 302 operating in accordance with electrostatic principles, that is, they are electrostatic transfer heads.

Figure 4D:
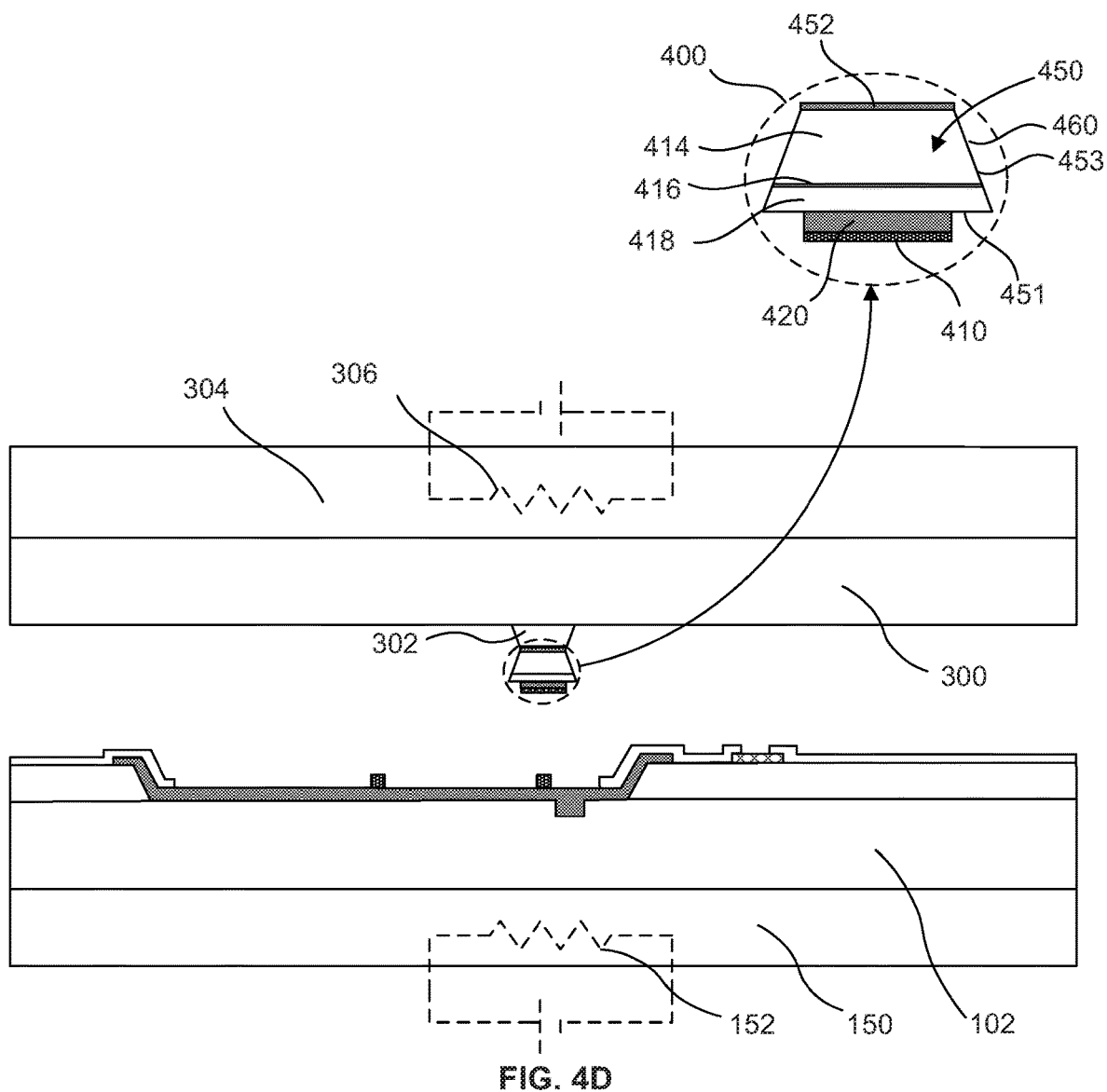

FIG. 4D is a cross-sectional side view illustration of a transfer head 302 holding a micro LED device 400 over a TFT substrate 102 in accordance with an embodiment of the invention. In the embodiment illustrated, the transfer head 302 is supported by a transfer head substrate 300. As described above, a heater 306 and heat distribution plate 304 may optionally be attached to the transfer head substrate to apply heat to the transfer head 302. A heater 152 and heat distribution plate 150 may also, or alternatively, optionally be used to transfer heat to the bonding layer 140 on the TFT substrate 102 and/or optional bonding layer 410 on a micro LED device 400 described below.

Still referring to FIG. 4D, a close-up view of an exemplary micro LED device 400 is illustrated in accordance with an embodiment. It is to be appreciated, that the specific micro LED device 400 illustrated is exemplary and that embodiments of the invention are not limited. In the particular embodiment illustrated, the micro LED device 400 includes a micro p-n diode 450 and a bottom conductive contact 420. A bonding layer 410 may optionally be formed below the bottom conductive contact 420, with the bottom conductive contact 420 between the micro p-n diode 450 and the bonding layer 410. In an embodiment, the micro LED device 400 further includes a top conductive contact 452. In an embodiment, the micro p-n diode 450 includes a top n-doped layer 414, one or more quantum well layers 416, and a lower p-doped layer 418. In other embodiments, the arrangement of n-doped and p-doped layers can be reversed. The micro p-n diodes can be fabricated with straight sidewalls or tapered sidewalls. In certain embodiments, the micro p-n diodes 450 possess outwardly tapered sidewalls 453 (from top to bottom). In certain embodiments, the micro p-n diodes 450 possess inwardly tapered sidewall (from top to bottom). The top and bottom conductive contacts 420, 452. For example, the bottom conductive contact 420 may include an electrode layer and a barrier layer between the electrode layer and the optional bonding layer 410. The top and bottom conductive contacts 420, 452 may be transparent to the visible wavelength range (e.g. 380 nm-750 nm) or opaque. The top and bottom conductive contacts 420, 452 may optionally include a reflective layer, such as a silver layer. The micro p-n diode and conductive contacts may each have a top surface, a bottom surface and sidewalls. In an embodiment, the bottom surface 451 of the micro p-n diode 450 is wider than the top surface of the micro p-n diode, and the sidewalls 453 are tapered outwardly from top to bottom. The top surface of the micro p-n diode 450 may be wider than the bottom surface of the p-n diode, or approximately the same width. In an embodiment, the bottom surface 451 of the micro p-n diode 450 is wider than the top surface of the bottom conductive contact 420. The bottom surface of the micro p-n diode may also be approximately the same width as the top surface of the bottom conductive contact 420. In an embodiment, the micro p-n diode 450 is several microns thick, such as 3 μm or 5 μm, the conductive contacts 420, 452 are 0.1 μm-2 μm thick, and the optional bonding layer 410 is 0.1 μm-1 μm thick. In an embodiment, a maximum width of each micro LED device 400 is 1-100 μm, for example, 30 μm, 10 μm, or 5 μm. In an embodiment, the maximum width of each micro LED device 400 must comply with the available space in the bank opening 128 for a particular resolution and PPI of the display panel.

Figure 4E:
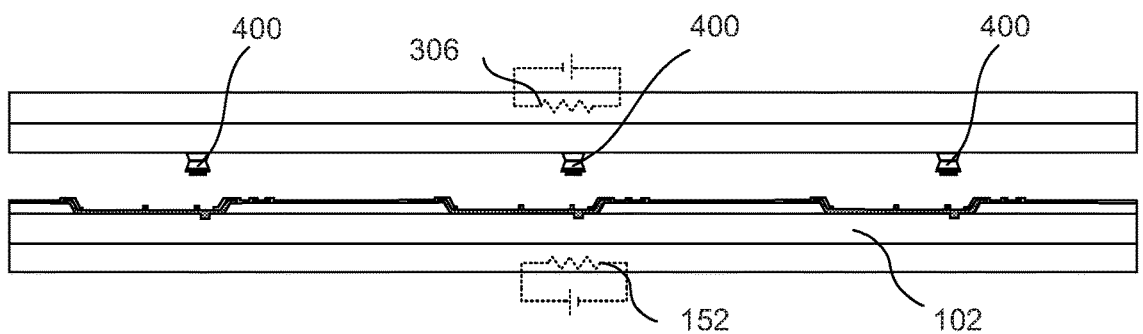

FIG. 4E is a cross-sectional side view illustration of an array of transfer heads holding an array micro LED devices 400 over a TFT substrate 102 accordance with an embodiment of the invention. FIG. 4E is substantially similar to the structure illustrated in FIG. 4D with the primary difference being the illustration of the transfer of an array of micro LED devices as opposed to a single micro LED device within the array of micro LED devices.

Figure 4F:
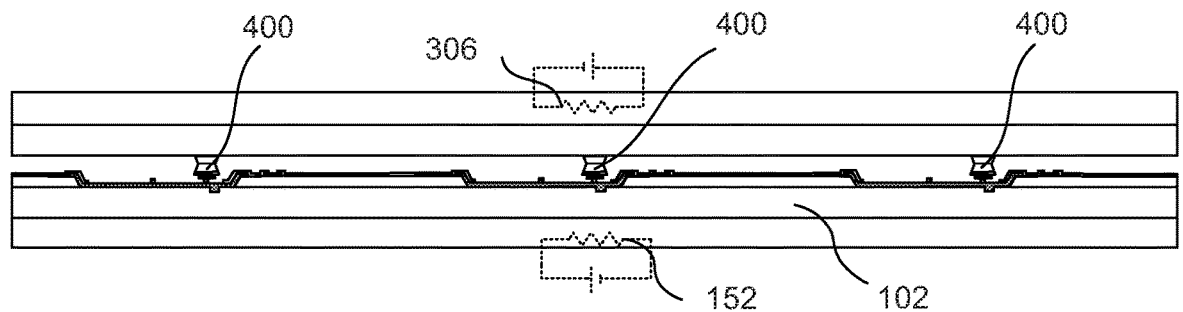

Referring now to FIG. 4F the TFT substrate 102 is contacted with the array of micro LED devices 400. In the embodiment illustrated, contacting the TFT substrate 102 with the array of micro LED devices 400 includes contacting bonding layer 140 with a micro LED device bonding layer 410 for each respective micro LED device. In an embodiment, each micro LED device bonding layer 410 is wider than a corresponding bonding layer 140. In an embodiment energy is transferred from the electrostatic transfer head assembly and through the array of micro LED devices 400 to bond the array of micro LED devices 400 to the TFT substrate 102. For example, thermal energy may be transferred to facilitate several types of bonding mechanisms such as eutectic alloy bonding, transient liquid phase bonding, and solid state diffusion bonding. The transfer of thermal energy may also be accompanied by the application of pressure from the electrostatic transfer head assembly.

Figure 4G:
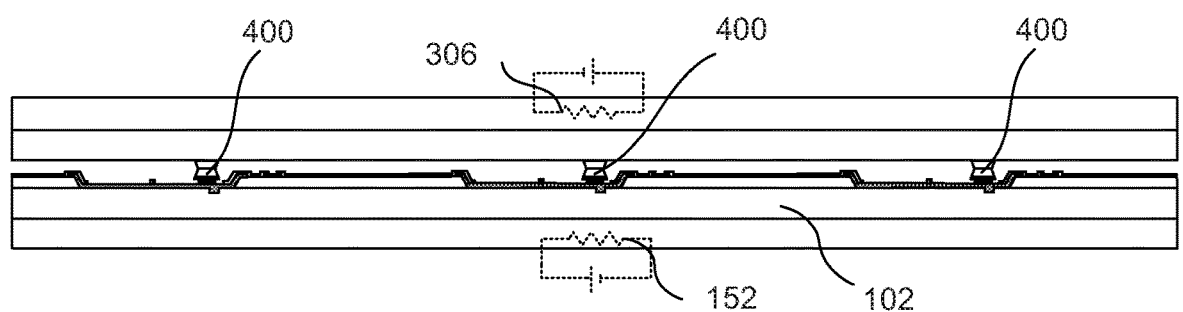

Referring to FIG. 4G, in an embodiment, the transfer of energy liquefies bonding layer 140. The liquefied bonding layer 140 may act as a cushion and partially compensate for system uneven leveling (e.g. nonplanar surfaces) between the array of micro devices 400 and the TFT substrate during bonding, and for variations in height of the micro LED devices. In the particular implementation of transient liquid phase bonding the liquefied bonding layer 140 inter-diffuses with the micro LED device bonding layer 410 to form an inter-metallic compound layer with an ambient melting temperature higher than the ambient melting temperature of the bonding layer 140. Accordingly, transient liquid phase bonding may be accomplished at or above the lowest liquidus temperature of the bonding layers. In some embodiments of the invention, the micro LED device bonding layer 410 is formed of a material having a melting temperature above 250° C. such as bismuth (271.4° C.), or a melting temperature above 350° C. such as gold (1064° C.), copper (1084° C.), silver (962° C.), aluminum (660° C.), zinc (419.5° C.), or nickel (1453° C.), and the TFT substrate bonding layer 140 has a melting temperature below 250° C. such as tin (232° C.) or indium (156.7° C.).

In this manner, the substrate 150 supporting the TFT substrate 102 can be heated to a temperature below the melting temperature of the bonding layer 140, and the substrate 304 supporting the array of transfer heads is heated to a temperature below the melting temperature of bonding layer 410, but above the melting temperature of bonding layer 140. In such an embodiment, the transfer of heat from the electrostatic transfer head assembly through the array of micro LED devices 400 is sufficient to form the transient liquid state of bonding layer 140 with subsequent isothermal solidification as an inter-metallic compound. While in the liquid phase, the lower melting temperature material both spreads out over the surface and diffused into a solid solution of the higher melting temperature material or dissolves the higher melting temperature material and solidifies as an inter-metallic compound. In a specific embodiment, the substrate 304 supporting the array of transfer heads is held at 180° C., bonding layer 410 is formed of gold, and bonding layer 140 is formed of indium.

Figure 4H:
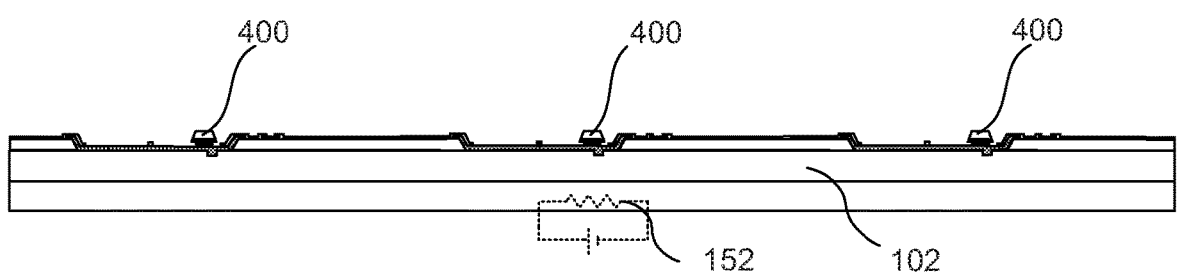

Following the transfer of energy to bond the array of micro LED devices 400 to the TFT substrate, the array of micro LED devices 400 are released onto the receiving substrate and the array of electrostatic transfer heads are moved away as illustrated in FIG. 4H. Releasing the array of micro LED devices 400 may be accomplished with a variety of methods including turning off the electrostatic voltage sources, lowering the voltage across the electrostatic transfer head electrodes, changing a waveform of an AC voltage, and grounding the voltage sources.

Figure 5A:
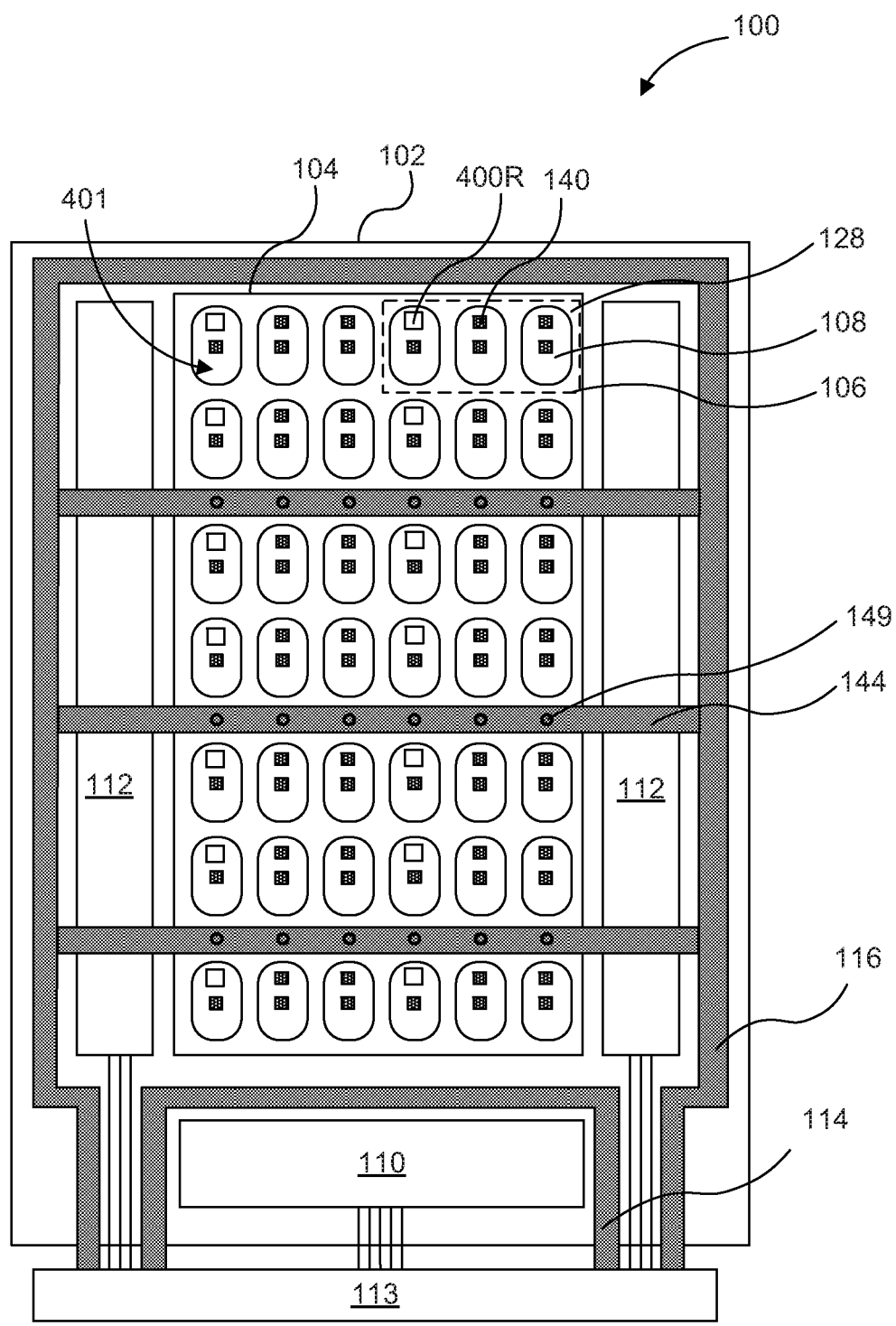
FIGS. 5A-5F are top view illustrations for a sequence of transferring an array of micro LED devices with different color emissions in accordance with an embodiment of the invention.
Figure 5B:
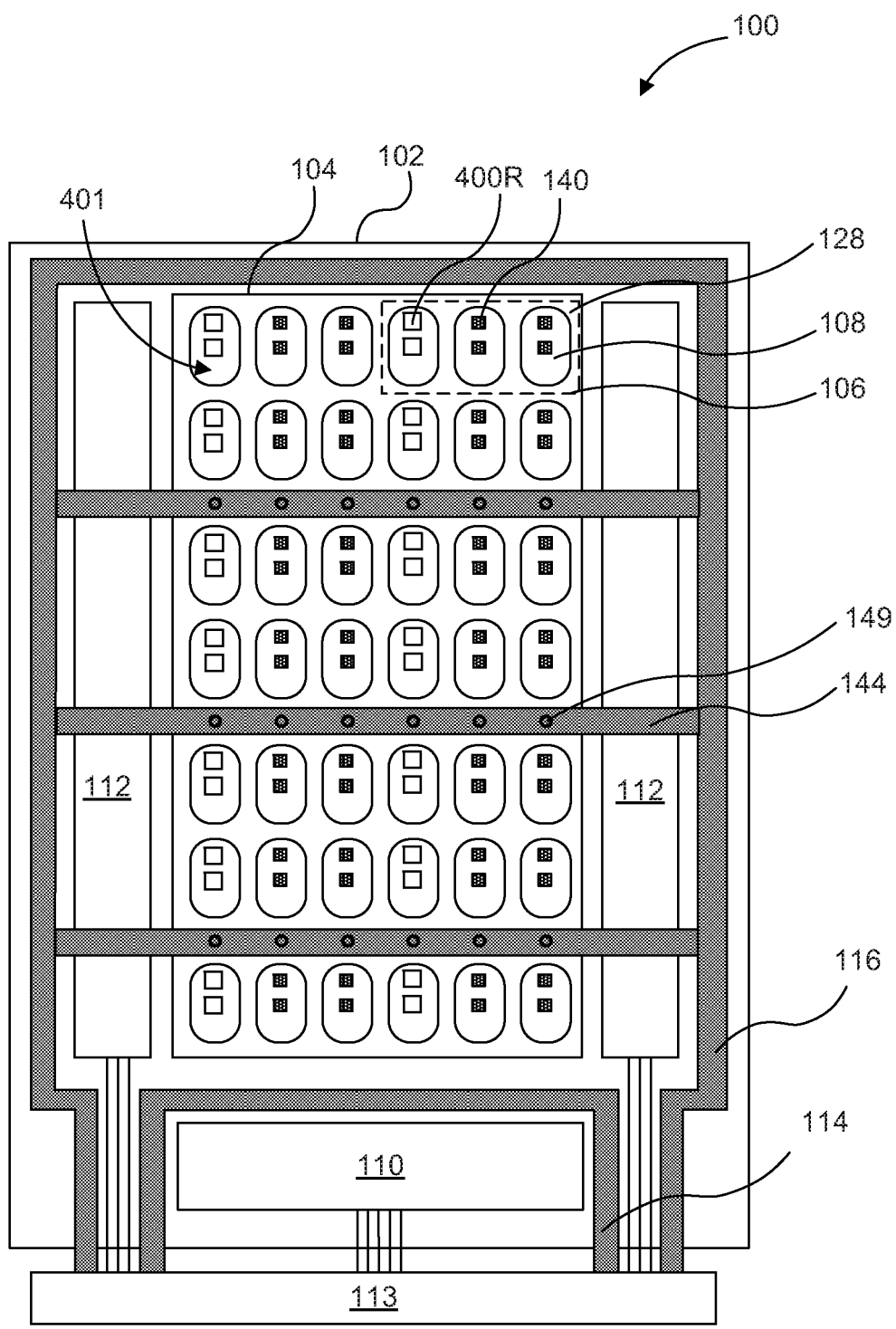

Referring now to FIGS. 5A-5F, a sequence of transferring an array of micro LED devices 400 with different color emissions is illustrated in accordance with an embodiment of the invention. In the particular configuration illustrated in FIG. 5A, a first transfer procedure has been completed for transferring an array of red-emitting micro LED devices 400R from a first carrier substrate to the TFT substrate 102. For example, where the micro LED devices 400R are designed to emit a red light (e.g. 620-750 nm wavelength) the micro p-n diode 450 may include a material such as aluminum gallium arsenide (AlGaAs), gallium arsenide phosphide (GaAsP), aluminum gallium indium phosphide (AlGaInP), and gallium phosphide (GaP). Referring to FIG. 5B, a second transfer procedure has been completed for transferring a redundant array of red-emitting micro LED devices 400R. For example, the redundant array could be transferred from a different carrier substrate, or from a different area (e.g. from opposite side, different areas do not overlap, or random selection) of the first carrier substrate in order to decrease the probability of transferring a second array from a same correlated defect area or contaminated area (e.g. particulates) of the first carrier substrate. In this manner, by transferring from two uncorrelated areas it may be possible to reduce the likelihood of transferring two defective micro LED devices 400 to the same bank structure 128, or alternatively transferring no micro LED devices 400 to a single bank structure 128 because it was not possible to pick up the micro LED devices in a defective or contaminated area of a carrier substrate. In yet another embodiment, by using a redundant array from two different wafers it may be possible to obtain a mix of both colors, and tune the average power consumption of the display based upon a pre-existing knowledge of the primary emission wavelength of the micro LED devices on different wafers. For example, where the first wafer is known to have an average red emission of 630 nm with a first power consumption while a second wafer is known to have an average red emission of 610 emission with a second power consumption, the redundancy array can be composed of micro LED devices from both wafers to obtain an average power consumption or alternate color gamut.

Figure 5C:
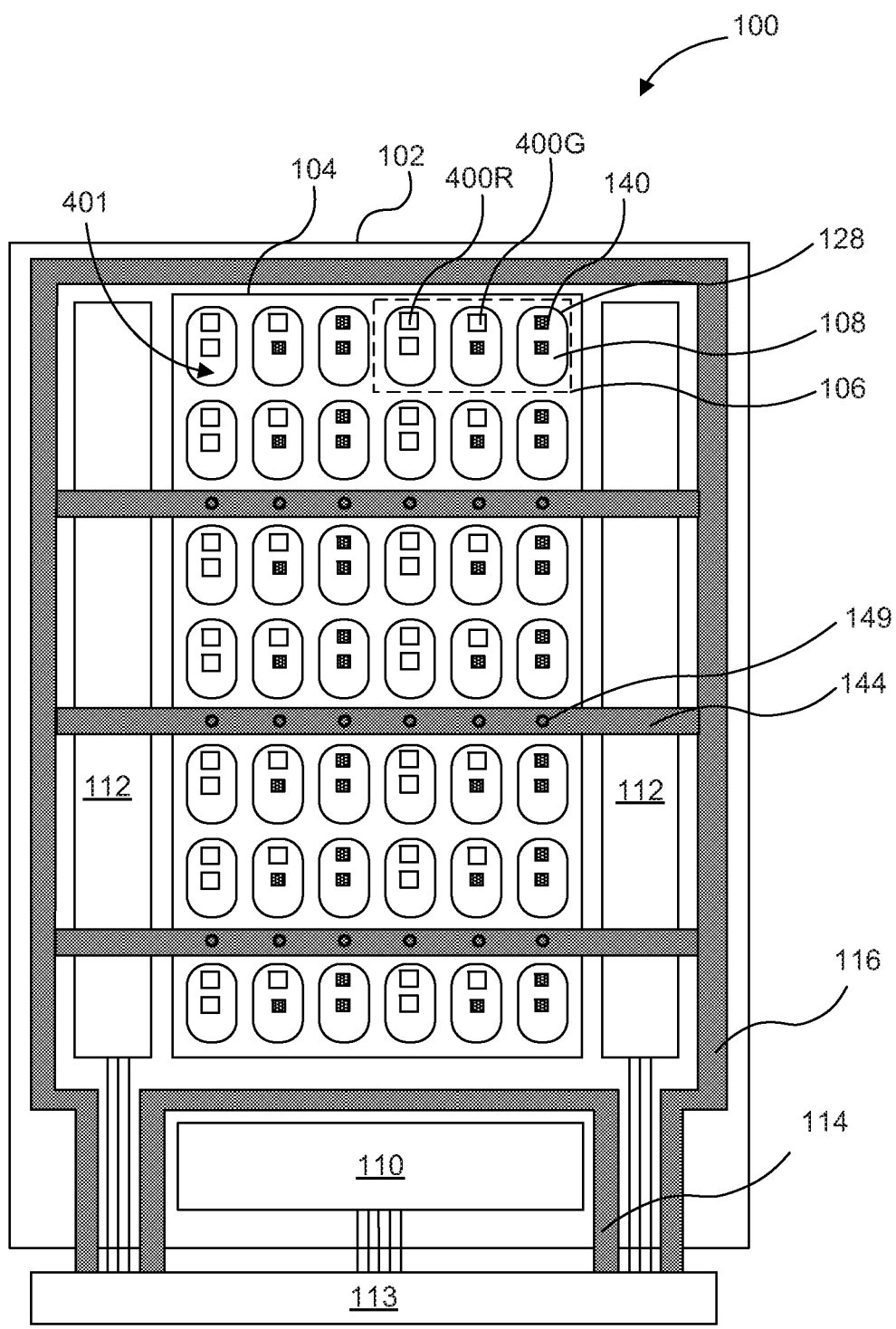
Figure 5D:
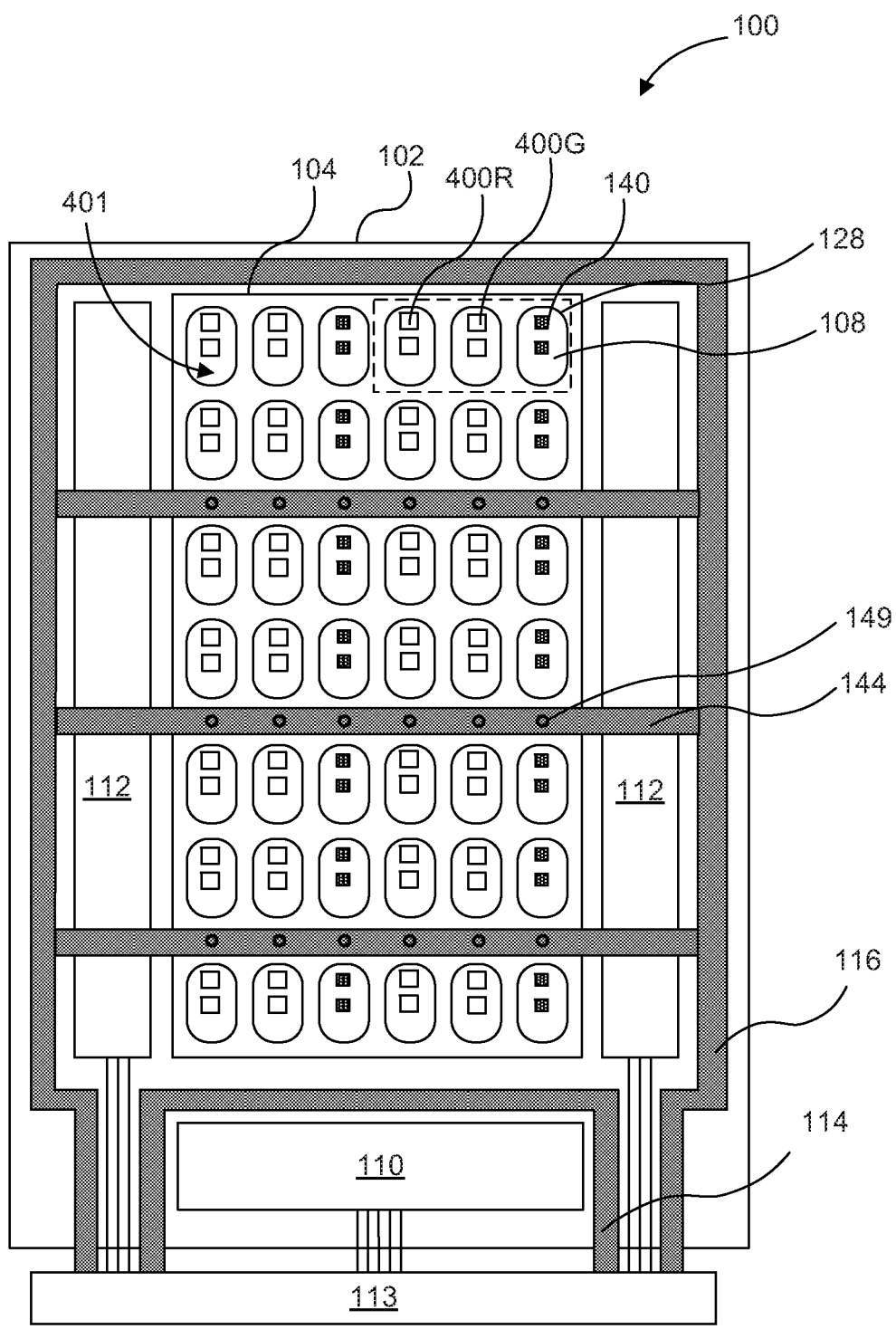

Referring to FIG. 5C, a third transfer procedure has been completed for transferring an array of green-emitting micro LED devices 400G from a second carrier substrate to the TFT substrate 102. For example, where the micro LED devices 400G are designed to emit a green light (e.g. 495-570 nm wavelength) the micro p-n diode 450 may include a material such as indium gallium nitride (InGaN), gallium nitride (GaN), gallium phosphide (GaP), aluminum gallium indium phosphide (AlGaInP), and aluminum gallium phosphide (AlGaP). A fourth transfer procedure for transferring a redundant array of green-emitting micro LED devices 400G is illustrated in FIG. 5D, similarly as before.

Figure 5E:
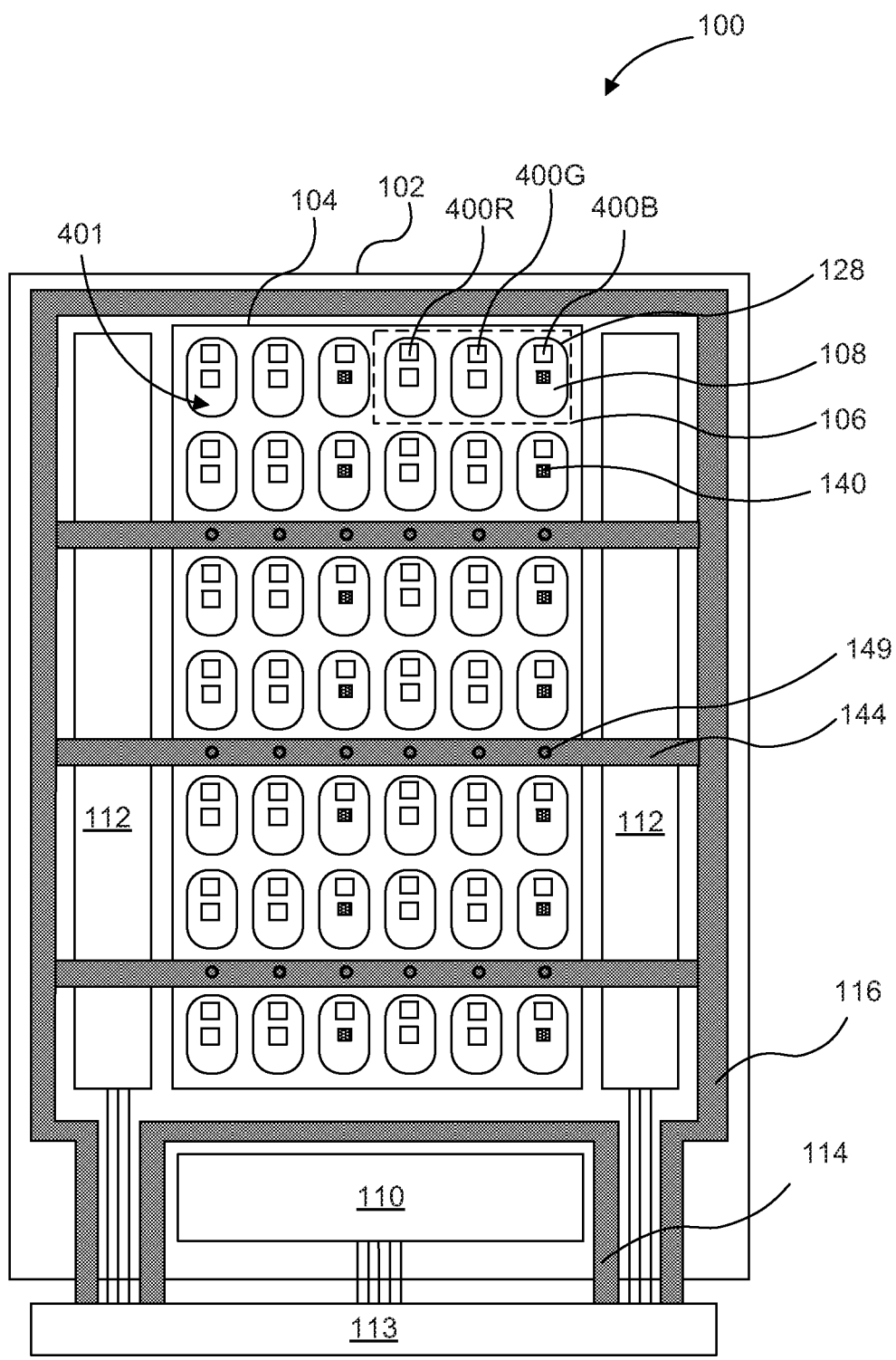
Figure 5F:
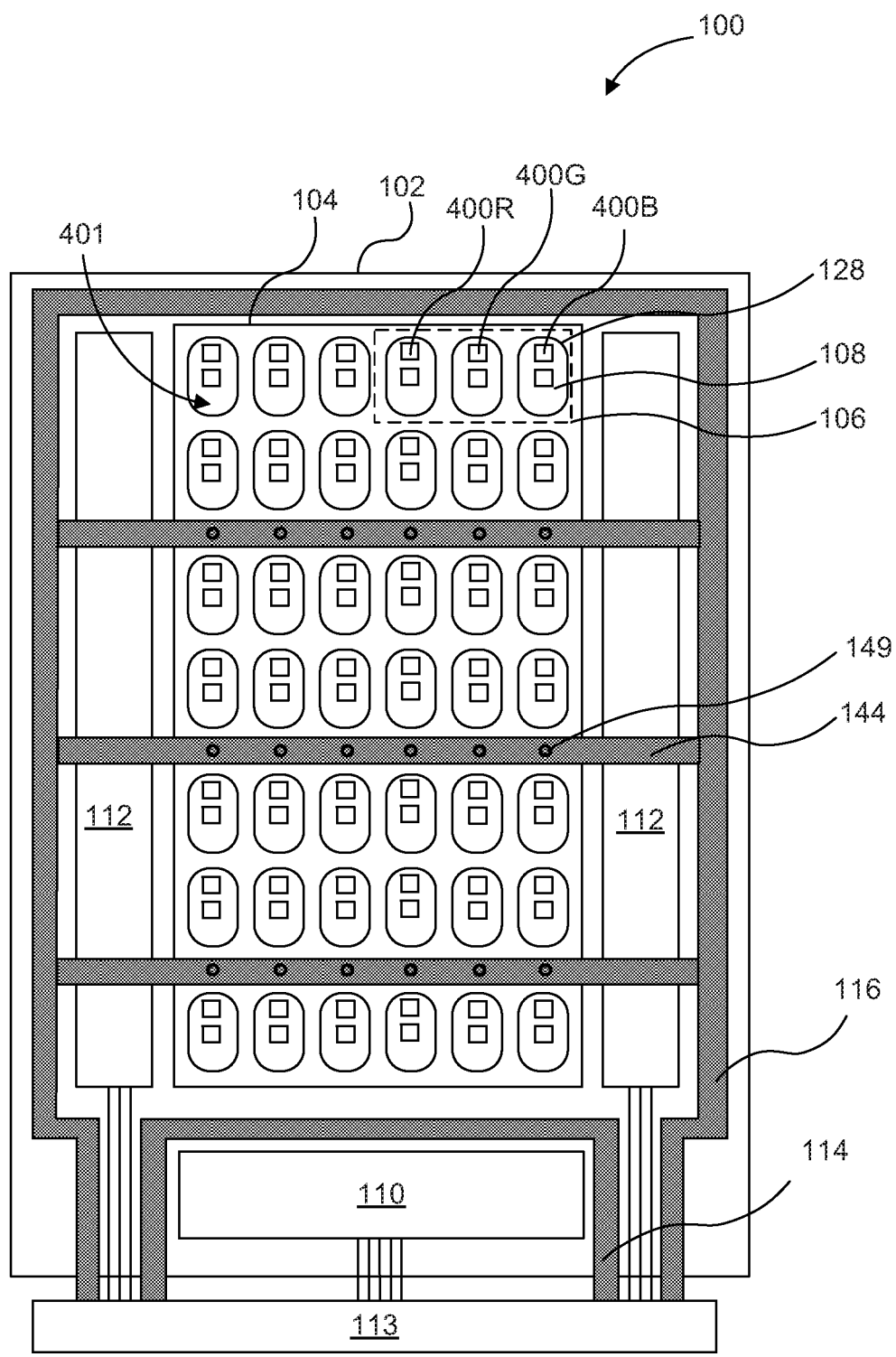

Referring to FIG. 5E, a fifth transfer procedure has been completed for transferring an array of blue-emitting micro LED devices 400B from a third carrier substrate to the TFT substrate 102. For example, where the micro LED devices 400B are designed to emit a blue light (e.g. 450-495 nm wavelength) the micro p-n diode 450 may include a material such as gallium nitride (GaN), indium gallium nitride (InGaN), and zinc selenide (ZnSe). A sixth transfer procedure for transferring a redundant array of blue-emitting micro LED devices 400B is illustrated in FIG. 5F, similarly as before.

In the particular embodiments described above with regard to FIGS. 5A-5F, the first and second micro LED devices 400 for each subpixel are separately transferred. For example, this may reduce the probability of correlated defects. However, in other embodiments it is possible to simultaneously transfer the first and second micro LED devices from the same carrier substrate. In this manner, simultaneous transfer may increase production throughput while still offering some of the benefits of a redundancy scheme at the expense of the possibility of correlated defects due to transferring micro LED devices from the same area of a carrier substrate. In such an embodiment the processing sequence would resemble the sequence in the following order of FIG. 5B, 5D, 5F.

In accordance with embodiments of the invention, the transfer heads are separated by a pitch (x, y, and/or diagonal) that matches a pitch of the bank openings on the backplane corresponding to the pixel or subpixel array. Table 1 provides a list of exemplary implementations in accordance with embodiments of the invention for various red-green-blue (RGB) displays with 1920×1080p and 2560×1600 resolutions. It is to be appreciated that embodiments of the invention are not limited to RGB color schemes or the 1920×1080p or 2560×1600 resolutions, and that the specific resolution and RGB color scheme is for illustrational purposes only.

TABLE 1

| Display Substrate | Pixel Pitch (x, y) | Sub-Pixel pitch (x, y) | Pixels per inch (PPI) | Possible transfer head array pitch |
|---|---|---|---|---|
| 55" 1920 × 1080 | (634 μm, 634 μm) | (211 μm, 634 μm) | 40 | X: Multiples or fractions of 211 μm<br>Y: Multiples or fractions of 634 μm |
| 10" 2560 × 1600 | (85 μm, 85 μm) | (28 μm, 85 μm) | 299 | X: Multiples or fractions of 28 μm<br>Y: Multiples or fractions of 85 μm |
| 4" 640 × 1136 | (78 μm, 78 μm) | (26 μm, 78 μm) | 326 | X: Multiples or fractions of 26 μm<br>Y: Multiples or fractions of 78 μm |
| 5" 1920 × 1080 | (58 μm, 58 μm) | (19 μm, 58 μm) | 440 | X: Multiples or fractions of 19 μm<br>Y: Multiples or fractions of 58 μm |

In the above exemplary embodiments, the 40 PPI pixel density may correspond to a 55 inch 1920×1080p resolution television, and the 326 and 440 PPI pixel density may correspond to a handheld device with RETINA® display. In accordance with embodiments of the invention, thousands, millions, or even hundreds of millions of transfer heads can be included in a micro pick up array of a mass transfer tool depending upon the size of the micro pick up array. In accordance with embodiments of the invention, a 1 cm×1.12 cm array of transfer heads can include 837 transfer heads with a 211 µm, 634 µm pitch, and 102,000 transfer heads with a 19 µm, 58 µm pitch.

The number of micro LED devices picked up with the array of transfer heads may or may not match the pitch of transfer heads. For example, an array of transfer heads separated by a pitch of 19 µm picks up an array of micro LED devices with a pitch of 19 µm. In another example, an array of transfer heads separated by a pitch of 19 µm picks up an array of micro LED devices with a pitch of approximately 6.33 µm. In this manner the transfer heads pick up every third micro LED device for transfer to the backplane. In accordance with some embodiments, the top surface of the array of light emitting micro devices is higher than the top surface of the insulating layer so as to prevent the transfer heads from being damaged by or damaging the insulating layer (or any intervening layer) on the blackplane during placement of the micro LED devices within bank openings.

Figure 6A:
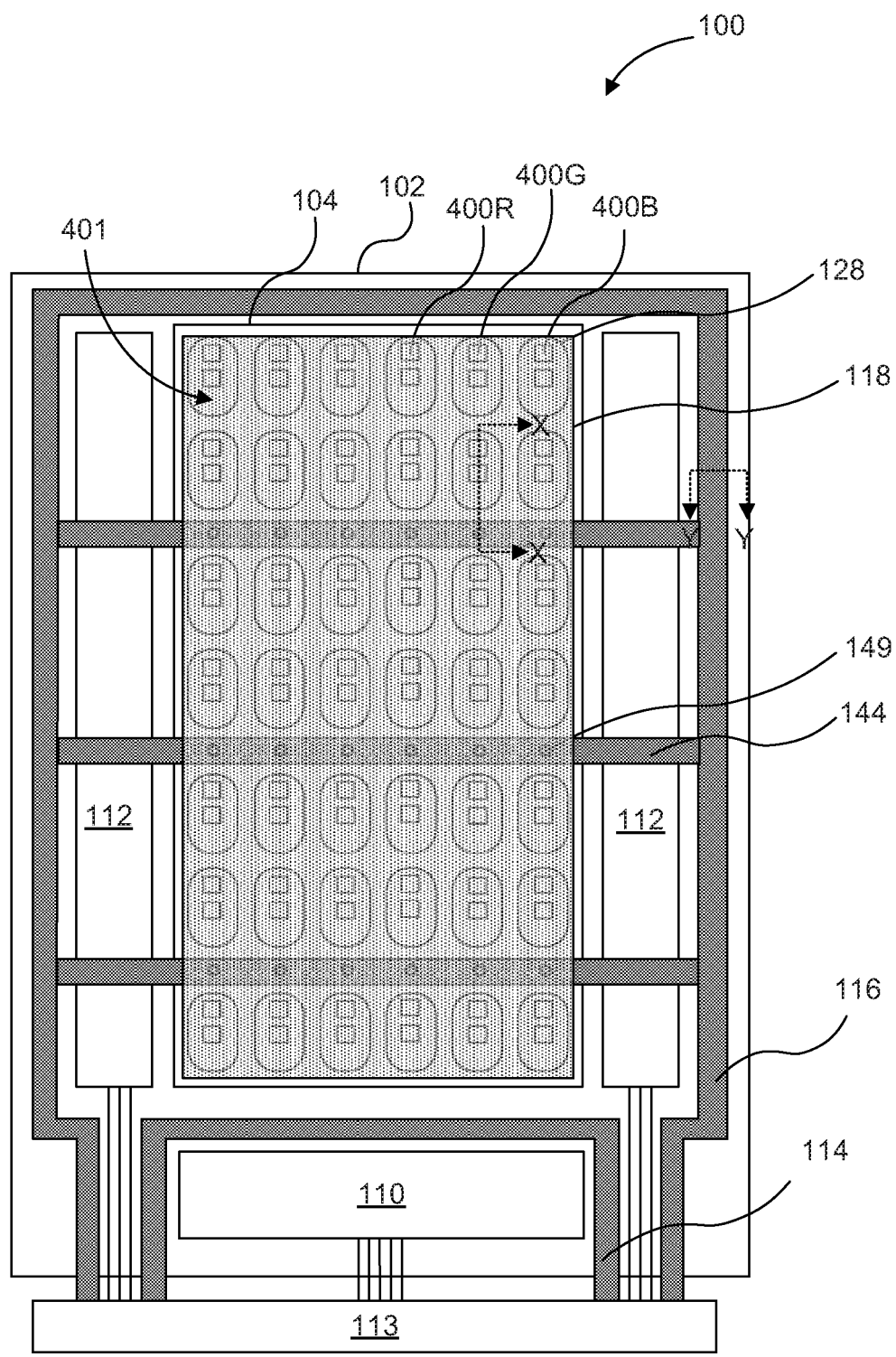
FIG. 6A is a top view illustration of an active matrix display panel after the formation of a top electrode layer in accordance with an embodiment.
Figure 6B:
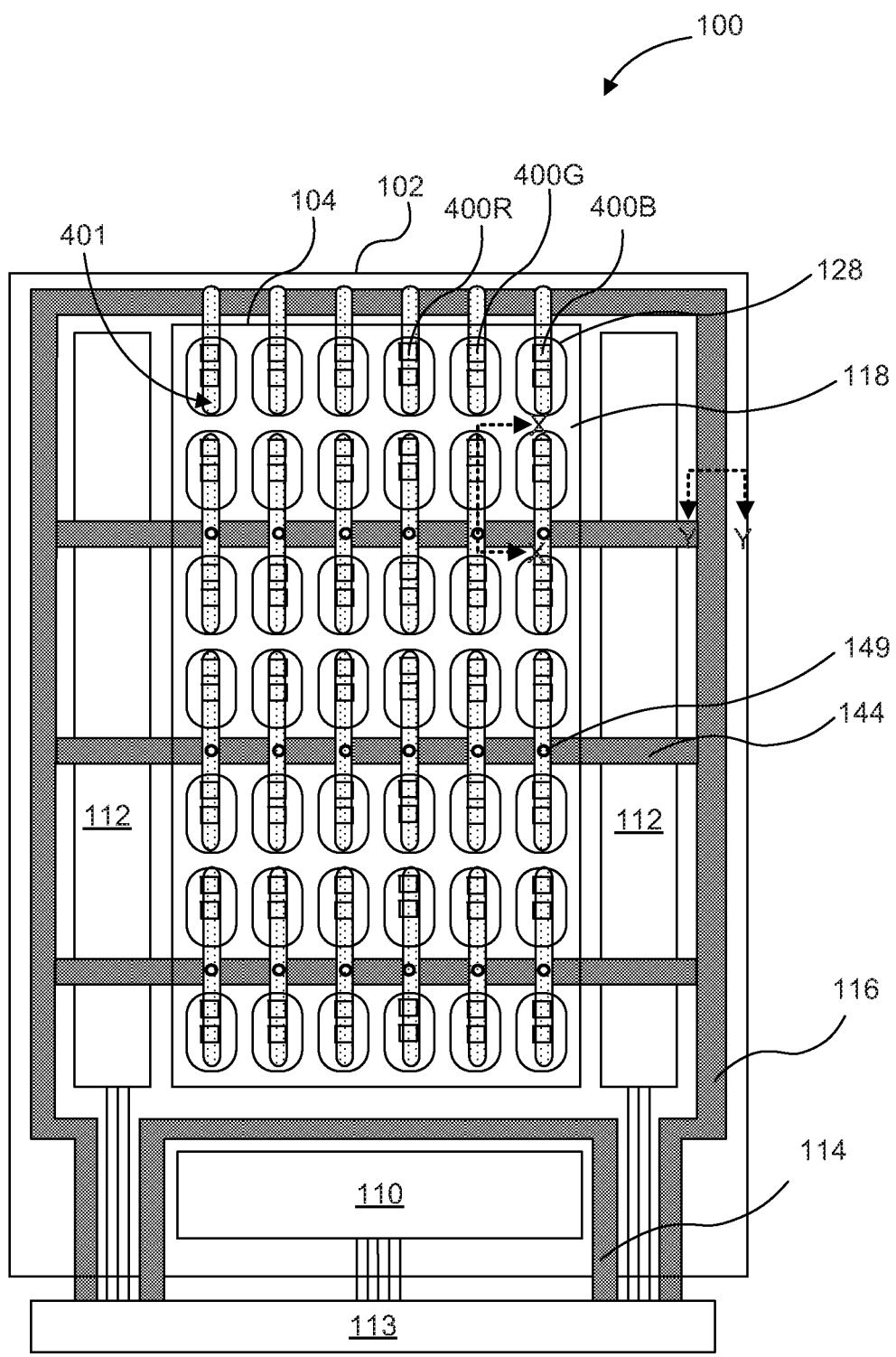
FIG. 6B is a top view illustration of an active matrix display panel after the formation of separate top electrode layers in accordance with an embodiment.
Figure 6C:
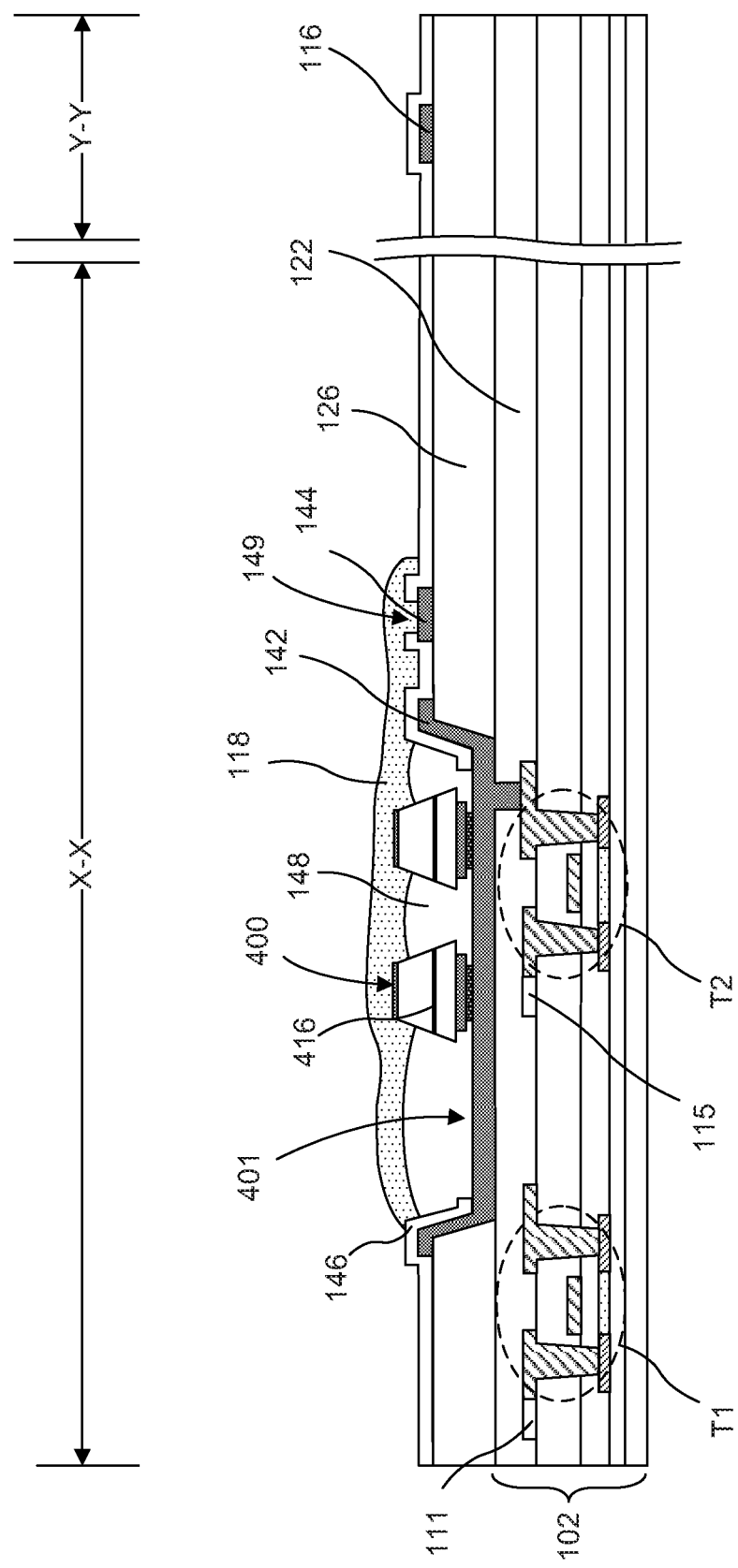
FIG. 6C is a side-view illustration of the active matrix display panel of either FIG. 6A or FIG. 6B taken along lines X-X and Y-Y in accordance with an embodiment of the invention.
Figure 6D:
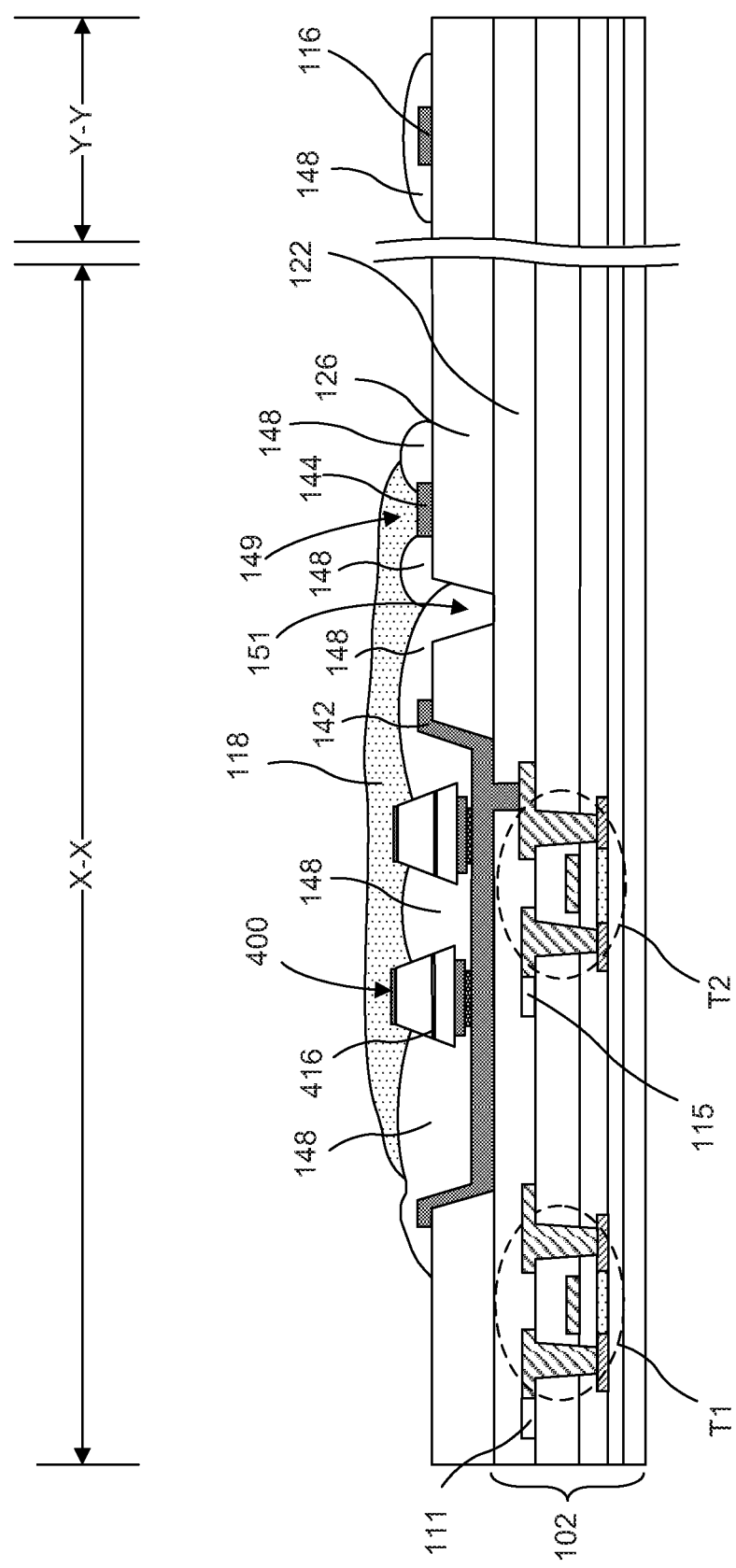
FIG. 6D is a side-view illustration of the active matrix display panel of either FIG. 6A or FIG. 6B taken along lines X-X and Y-Y in accordance with an embodiment of the invention.

FIG. 6A is a top view illustration of an active matrix display panel in accordance with an embodiment after the formation of a top electrode layer. FIG. 6B is a top view illustration of an active matrix display panel in accordance with an embodiment after the formation of separate top electrode layers. FIGS. 6C-6D are side-view illustrations of the active matrix display panel of either FIG. 6A or FIG. 6B taken along lines X-X and Y-Y in accordance with embodiments of the invention. In accordance with the embodiments illustrated in FIGS. 6A-6B, one or more top electrode layers 118 are formed over the pixel area 104 including the array of micro LED devices 400, as well as formed within the openings 149 and in electrical contact with the ground tie lines 144 running between the bank openings 128 in the pixel area 104.

Referring now to FIGS. 6C-6D, prior to forming the one or more top electrode layers 118 the micro LED devices 400 are passivated within the bank openings 128 in order to prevent electrical shorting between the top and bottom electrode layers 118, 142, or shorting at the one or more quantum wells 416. As illustrated, after the transfer of the array micro LED devices 400, a passivation layer 148 may be formed around the sidewalls of the micro LED devices 400 within the array of bank openings 128. In an embodiment, where the micro LED devices 400 are vertical LED devices, the passivation layer 148 covers and spans the quantum well structure 416. The passivation layer 148 may also cover any portions of the bottom electrode layer 142 not already covered by the optional insulator layer 146 in order to prevent possible shorting. Accordingly, the passivation layer 148 may be used to passivate the quantum well structure 416, as well as the bottom electrode layer 142. In accordance with embodiments of the invention, the passivation layer 148 is not formed on the top surface of the micro LED devices 400, such as top conductive contact 452. In one embodiment, a plasma etching process, e.g. $O_2$ or $CF_4$ plasma etch, can be used after forming the passivation layer 148 to etch back the passivation layer 148, ensuring the top surface of the micro LED devices 400, such as top conductive contacts 452, are exposed to enable the top conductive electrode 118 layers 118 to make electrical contact with the micro LED devices 400.

In accordance with embodiments of the invention, the passivation layer 148 may be transparent or semi-transparent to the visible wavelength so as to not significantly degrade light extraction efficiency of the completed system. Passivation layer may be formed of a variety of materials such as, but not limited to epoxy, acrylic (polyacrylate) such as poly(methyl methacrylate) (PMMA), benzocyclobutene (BCB), polyimide, and polyester. In an embodiment, passivation layer 148 is formed by ink jet printing or screen printing around the micro LED devices 400.

In the particular embodiment illustrated in FIG. 6C, the passivation layer 148 is only formed within the bank openings 128. However, this is not required, and the passivation layer 148 may be formed on top of the bank structure layer 126. Furthermore, the formation of insulator layer 146 is not required, and passivation layer 148 can also be used to electrically insulate the conductive layers. As shown in the embodiment illustrated in FIG. 6D, the passivation layer 148 may also be used to passivate sidewalls of the conductive layer forming the bottom electrode 142 and ground tie lines 144. In an embodiment, passivation layer 148 may optionally be used to passivate ground ring 116. In accordance with some embodiments, the formation of openings 149 can be formed during the process of ink jet printing or screen printing the passivation layer 148 over the ground tie lines 144. Openings may also optionally be formed over the ground ring 116. In this manner, a separate patterning operation may not be required to form the openings.

In accordance with some embodiments of the invention a canal 151, or well structure, can be formed within the bank layer 126 as illustrated in FIG. 6C in order to capture or prevent the passivation layer 148 from spreading excessively and overflowing over the ground tie lines 144, particularly when the passivation layer 148 is formed using a solvent system such as with ink jet printing or screen printing. Accordingly, in some embodiments, a canal 151 is formed within the bank layer 126 between the bank opening 128 and an adjacent ground tie line 144.

Still referring to FIGS. 6C-6D, after formation of passivation layer 148 one or more top conductive electrode layers 118 are formed over each micro LED device 400 and in electrical contact with the top contact layer 452, if present. Depending upon the particular application in the following description, top electrode layers 118 may be opaque, reflective, transparent, or semi-transparent to the visible wavelength. For example, in top emission systems the top electrode layer 118 may be transparent, and for bottom emission systems the top electrode layer may be reflective. Exemplary transparent conductive materials include amorphous silicon, transparent conductive oxides (TCO) such as indium-tin-oxide (ITO) and indium-zinc-oxide (IZO), carbon nanotube film, or a transparent conductive polymer such as poly(3,4-ethylenedioxythiophene) (PEDOT), polyaniline, polyacetylene, polypyrrole, and polythiophene. In an embodiment, the top electrode layer 118 includes nanoparticles such as silver, gold, aluminum, molybdenum, titanium, tungsten, ITO, and IZO. In a particular embodiment, the top electrode layer 118 is formed by ink jet printing or screen printing ITO or a transparent conductive polymer such as PEDOT. Other methods of formation may include chemical vapor deposition (CVD), physical vapor deposition (PVD), spin coating. The top electrode layer 118 may also be reflective to the visible wavelength. In an embodiment, a top conductive electrode layer 118 comprises a reflective metallic film such as aluminum, molybdenum, titanium, titanium-tungsten, silver, or gold, or alloys thereof, for example for use in a bottom emission system.

In accordance with some embodiments of the invention the ground tie lines 144 may be more electrically conductive than the top electrode layer 118. In the embodiment illustrated in FIG. 3D, the ground tie lines 144 can be formed from the same metal layer used to formed the source/drain connections or gate electrode to one of the transistors (e.g.

T2) in the TFT substrate 102. For example, the ground tie lines 144 can be formed from a common interconnect material such as copper or aluminum, including their alloys. In the embodiments illustrated in FIGS. 3B-3C and FIGS. 6C-6D, the ground tie lines 144 may also be formed from the same material as the bottom electrode layers 142. For example, the ground tie lines 144 and bottom electrode layers 142 include a reflective material, which may also improve the electrical conductivity of the layers. In a specific example, the ground tie lines 144 and bottom electrodes may include a metallic film or metal particles. In accordance with some embodiments, the top electrode layer 118 is formed of a transparent or semi-transparent material such as amorphous silicon, transparent conductive oxides (TCO) such as indium-tin-oxide (ITO) and indium-zinc-oxide (IZO), carbon nanotube film, or a transparent conductive polymer such as poly(3,4-ethylenedioxythiophene) (PE-DOT), polyaniline, polyacetylene, polypyrrole, and polythiophene, all of which may have a lower electrical conductivity than a conductive and reflective bottom electrode layer including a metallic film within a film stack.

Referring back to FIG. 6A again, in the particular embodiment illustrated a top electrode layer 118 is formed over the pixel area 104 including the array of micro LED devices 400. The top electrode layer 118 may also be formed within the openings 149, if present, and in electrical contact with the ground tie lines 144 running between the bank openings 128 in the pixel area 104. In such an embodiment, since the ground tie lines 144 are in electrical connection with the ground ring 116, it is not necessary to form the top electrode layer 118 outside of the pixel area 104. As illustrated, the ground ring 116 may be buried beneath an electrically insulating layer such as insulator layer 146, passivation layer 148, or even bank structure layer 126 or planarization layer 122. While FIG. 6A is described and illustrates as including the top electrode layer 118 only over the pixel area 104, and including ground tie lines 144 embodiments of the invention are not so limited. For example, ground tie lines 144 are not necessary to establish a redundancy scheme and repair site, nor is it required that the top electrode layer not be formed over and in electrical contact with the ground ring 116, or ground line.

FIG. 6B illustrates an alternative embodiment in which separate top electrode layers 118 are formed connecting one or more micro LED devices 400 with one or more ground tie lines 144. In the particular embodiment illustrated in FIG. 6B, the top electrode layers 118 only need to provide the electrical path from a micro LED device 400 to a nearby ground tie line 144. Accordingly, it is not required for the top electrode layers 118 to cover the entire pixel area 104, or even the entire bank openings 128 for that matter. In the particular embodiment illustrated, each top electrode layer 118 connects the micro LED devices 400 within a pair of bank openings on opposite sides of an intermediate ground tie line 144. However, this particular configuration is exemplary and a number of different arrangements are possible. For example, a single top electrode layer 118 may run over, and electrically connect an n-number of rows of micro LED devices, or bank openings 128, to the ground tie lines or ground ring. As illustrated, the top electrode layer 118 may be formed within openings 149 to the ground tie lines 144. In such an embodiment, since the ground tie lines 144 are in electrical connection with the ground ring 116, it is not necessary to form the top electrode layer 118 outside of the pixel area 104.

As illustrated, the ground ring 116 may be buried beneath an electrically insulating layer such as insulator layer 146 in accordance with the embodiments illustrated in FIGS. 6A-6B. In the particular embodiments illustrated in FIG. 6B, topmost row of micro LED devices 400 are illustrated as being connected to the ground ring 116 with individual top electrode layers 118. In such an embodiment, each top electrode layer 118 may contact the ground ring 116 through one or more openings as previously described. Accordingly, while the embodiments illustrated in FIGS. 6A-6B provide one manner for connecting the micro LED devices 400 to ground tie lines 144 within the pixel area 104, this does not preclude using separate top electrode layers 118 to connect to the ground ring 116 without going through a ground tie line 144.

As illustrated in FIGS. 6A-6B, line width for the top electrode layers 118 can vary depending upon application. For example, the line width may approach that of the pixel area 104. Alternatively, the line width may be minimal. For example, line widths as low as approximately 15 µm may be accomplished with commercially available ink jet printers, and line widths as low as approximately 30 µm may be accomplished with commercially available screen printers. Accordingly, the line width of the top electrode layers 118 may be more or less than the maximum width of the micro LED devices.

In another aspect, the embodiments of the invention may be particularly suitable for localized formation of the top electrode layers 118 with ink jet printing or screen printing. Ink jet printing in particular may be suitable since it is a non-contact printing method. Conventional AMOLED backplane processing sequences such as those used for the fabrication of the display panels in FIGS. 1-2 typically blanket deposit the top electrode layer in deposition a chamber, followed by singulation of the individual backplanes 100 from a larger substrate. In accordance with some embodiments, the display panel 100 backplane is singulated from a larger substrate prior to transferring the array of micro LED devices 400. In an embodiment, ink jet printing or screen printing provides a practical approach for patterning the individual top electrode layers 118 without requiring a separate mask layer for each separate display panel 100.

Figure 7:
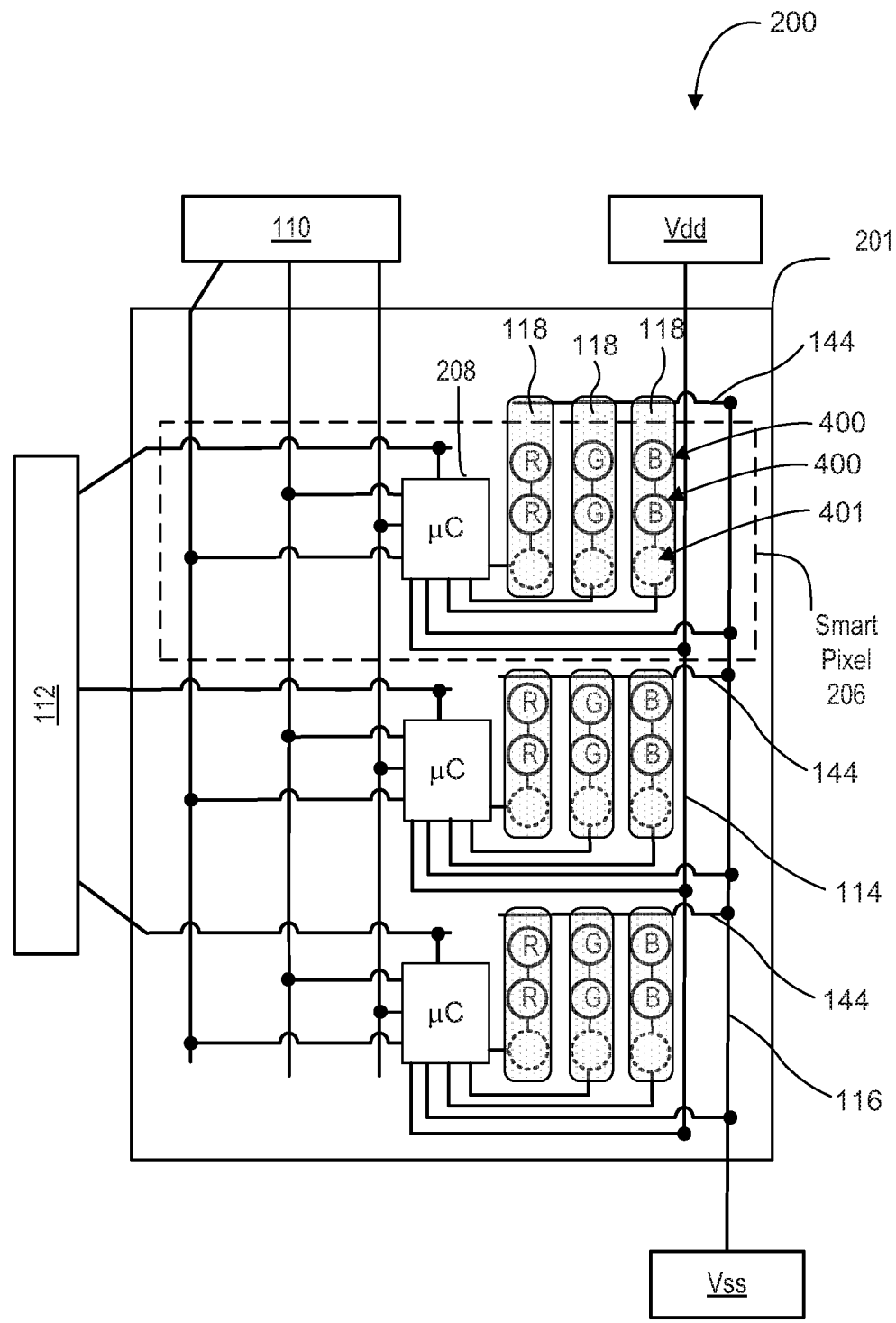
FIG. 7 is a top view schematic illustration of a smart pixel display including a redundancy and repair site configuration in accordance with an embodiment of the invention.

FIG. 7 is a top view schematic illustration of a smart pixel display including a redundancy and repair site configuration in accordance with an embodiment of the invention. As shown the display panel 200 includes a substrate 201 which may be opaque, transparent, rigid, or flexible. A smart pixel area 206 may include separate subpixels of different emission colors, and a micro controller chip 208 including the working circuitry described above with regard to the TFT substrate. In this manner, rather than forming the pixel area on a TFT substrate including the working circuitry, the micro LED devices 400 and micro controller chip 208 are both transferred to the same side or surface of the substrate 201. Electrical distribution lines can connect the micro controller chip 208 to the data driver circuit 110 and scan driver circuit 112 similarly as with a TFT substrate. Likewise, bank layer structures can be formed on the substrate 201 similarly as described above for the TFT substrate to contain the micro LED devices 400 and repair bonding site 401. Similarly, a top electrode layer 118, or separate top electrode layers 118 can connect the micro LED devices 400 to a ground tie line 144 or ground ring 116 similarly as described above with regard to the TFT substrate configuration. Thus, similar redundancy and repair site configurations can be formed with the smart pixel configuration as described above for the TFT substrate configurations.

Up until this point the redundancy and repair site configurations have been described without regard to whether any testing has been performed to detect defective, missing, or contaminated micro LED devices, or whether any repair options have been performed. Thus, up until this point embodiments of the invention have been described and illustrated assuming 100% transfer success of the micro LED devices to the display substrate, with no repair required. However, in practical application, it is not expected to always achieve 100% transfer success, and with no defective, missing, or contaminated micro LED devices. In accordance with embodiments of the invention, micro LED devices may be of 1 to 100 μm in scale, for example, having a maximum width of approximately 20 μm, 10 μm, or 5μm. Such micro LED devices are fabricated so that they are poised for pick up from a carrier substrate and transfer to the display substrate, for example, using an array of electrostatic transfer heads. Defective micro LED devices may result from a variety of reasons, such as contamination, stress fractures, and shorting between conductive layers. Micro LED devices also may not be picked up during the transfer operation due to a variety of reasons, such as non-planarity of the carrier substrate, contamination (e.g. particulates), or irregular adhesion of the micro LED devices to the carrier substrate.

Figure 8A:
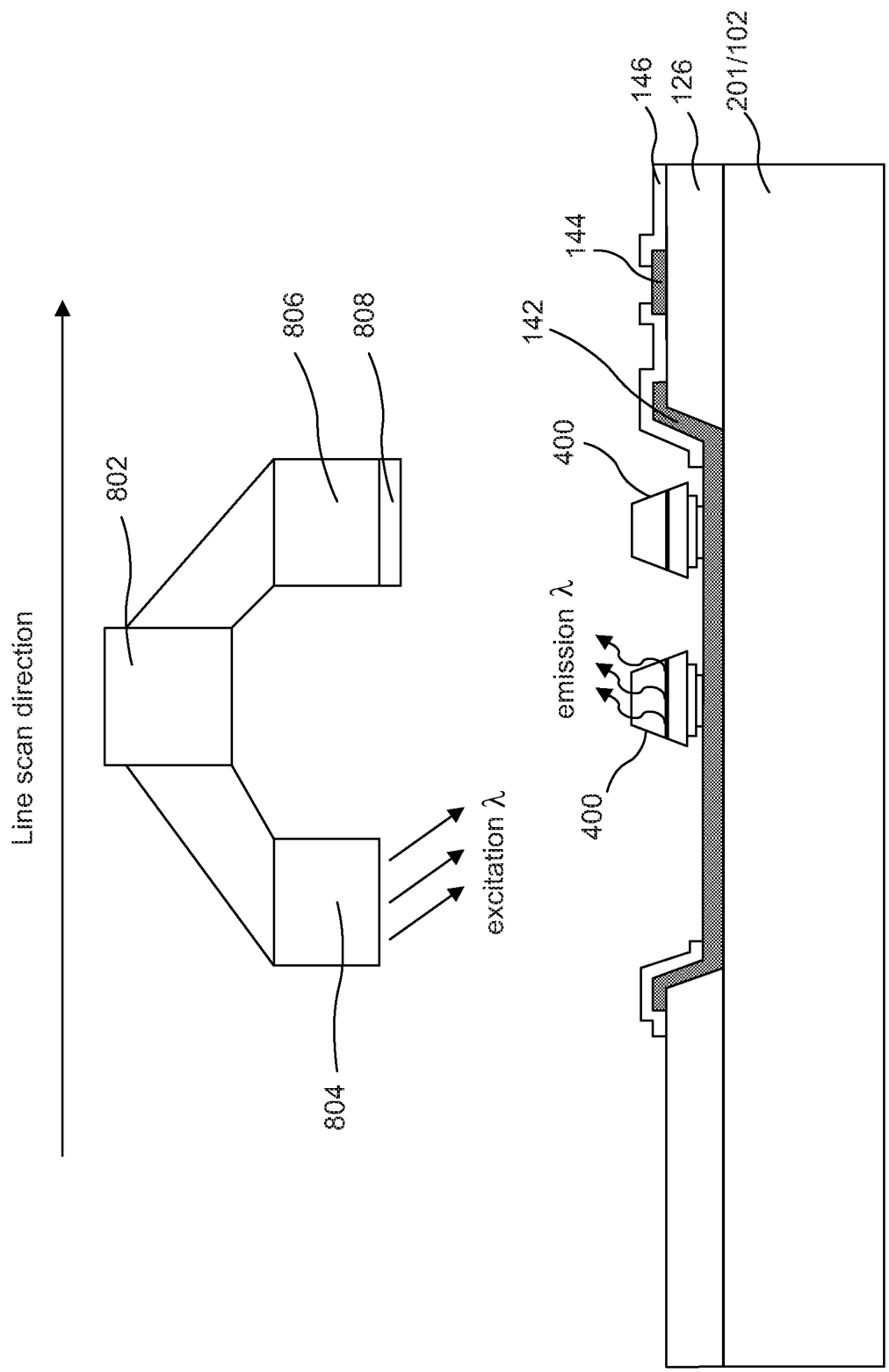
FIG. 8A is a schematic side view illustration of testing apparatus including a light source and camera in accordance with an embodiment of the invention.
Figure 8B:
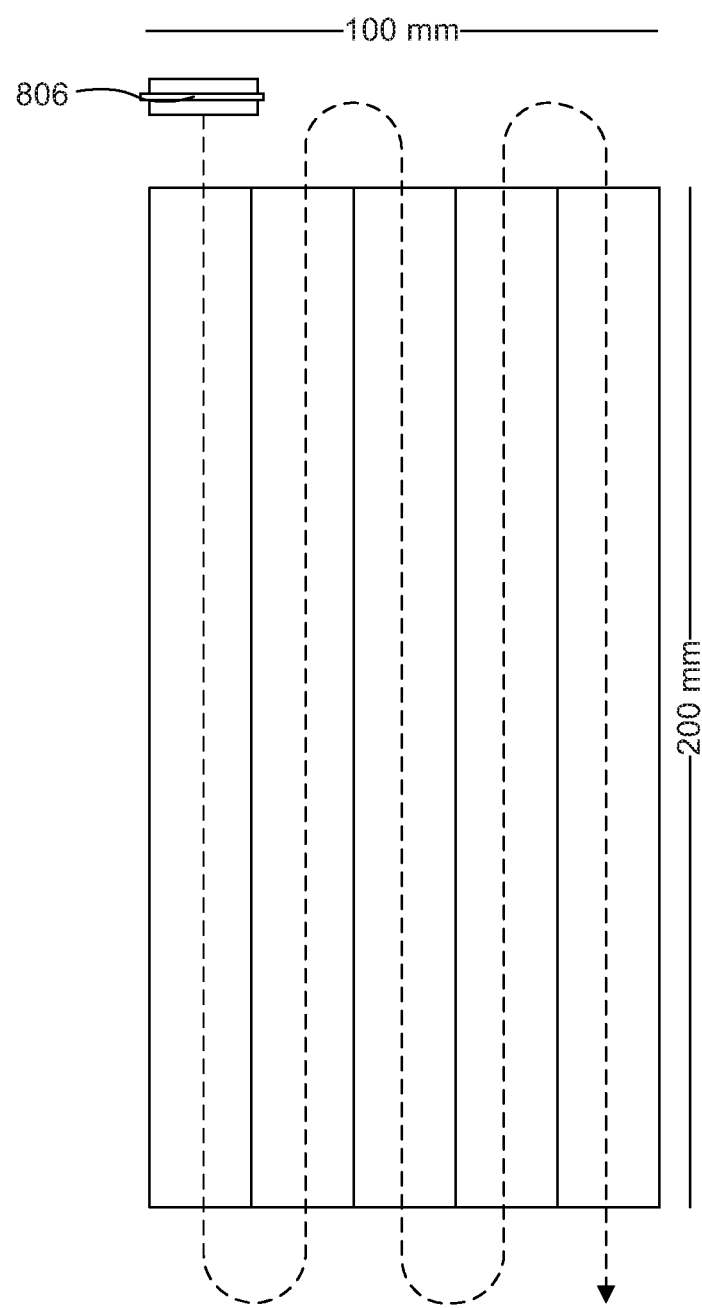
FIG. 8B is a schematic top view illustration of a scanning pattern in accordance with an embodiment of the invention.

FIGS. 8A-8B illustrate an integrated testing method in accordance with embodiments of the invention for detecting defective, missing, or contaminated micro LED devices after transfer of the micro LED devices from the carrier substrate to display substrate, such as the transfer operations illustrated in FIGS. 5A-5F, and prior to formation of the passivation layer 148 and top electrode layers 118. In this manner, detection of defective, missing, or contaminated micro LED devices can be used to potentially alter the deposition patterns of the passivation layer 148 and top electrode layers 118, and to potentially transfer replacement micro LED devices where required. Referring now to FIG. 8A, a carriage 802 supporting a light source 804 and camera 806 are scanned over the display substrate carrying the array of micro LED devices 400 which have been transferred and bonded to the bottom electrode layer 142.

In an embodiment, camera 806 is a line scan camera. For example, line scan cameras typically have a row of pixel sensors that can be used to provide a continuous feed to a computer system that joins the frames to make an image as the line scan camera is passed over an imaging surface. In an embodiment, camera 806 is a two dimensional (2D) camera having both x-y dimensions of pixels. In accordance with embodiments of the invention, camera 806 should have a resolution capable of imaging the micro LED devices 400, for example, having a maximum width of 1-100 μm. Resolution may be determined by the pixel size in the pixel sensors, and may be aided by the use of optics to increase the resolution. By way of example, in one embodiment, the micro LED devices 400 have a maximum width of approximately 5 μm. One exemplary line scan camera 806 which may be used is the BASLER RUNNER SERIES CAMERA (available from Basler AG of Ahrensburg, Germany) having a pixel size of 3.5 μm. With the addition of optics, this can allow for resolution down to approximately 1.75 μm for a 3.5 μm pixel size. Line scan cameras can also be selected for their line scan speed, and line scan width. For example, line scan speeds are achievable up to several meters per second, and line scan widths of are commonly available between 10 and 50 mm.

In one embodiment, the light source 804 is used for illuminating the surface to be scanned. For example, in one embodiment, the camera 806 is scanned over the substrate 201, 102 surface in order to verify whether or a micro LED device 400 has been placed in an intended location. In this manner, the camera 806 can be used to detect successful transfer for each micro LED device 400 from a carrier substrate to the display substrate 201, 102.

In another embodiment, light source 804 is used to emit an excitation wavelength of light to induce photoluminescence of the micro LED devices 400. The light source 804 may be a variety of light sources such as, but not limited to, LED lighting or excimer laser. In this manner, the line scan camera 806 can be used to detect specific emission wavelengths from the micro LED devices 400 that exhibit either no emission, or irregular emission. Accordingly, this information can be used to detect defects in the micro LED devices 400 that are otherwise not easily curable on the carrier substrate. As described above, the carrier substrate may include thousands, or millions of micro LED devices 400 that are poised for pick up and transfer. A variety of defects can arise during processing and integration of the micro LED devices 400 on the carrier substrate. These defects could potentially cause shorting or non-uniform emission once transferred to the display substrate 201, 102. However, it may not be optimal to cure individual defective micro LED devices 400 when they are on the carrier substrate. If a micro LED device 400 is defective on the carrier substrate, it may simply be more efficient to cure the defect with a redundancy scheme or repair site on the display substrate 201, 102 in accordance with embodiments of the invention.

In an embodiment, light source 804 emits a shorter wavelength of light than the wavelength of light that the target micro LED devices are designed to emit, to induce red shifting or fluorescence of light from the micro LED devices. In accordance with embodiments of the invention, the light source 804 may be tunable, or multiple light sources set to a desired wavelength are provided. For example, an excitation wavelength of 500-600 nm may be used to induce emission of red light (e.g. 620-750 nm wavelength) from the red-emitting micro LED devices 400R, an excitation wavelength of 430-470 nm may be used to induce emission of green light (e.g. 495-570 nm wavelength) from a the green-emitting micro LED devices 400G, and an excitation wavelength of 325-425 nm may be used to induce emission of blue light (e.g. 450-495 nm wavelength) from the blue-emitting micro LED devices 400B. However, these ranges are exemplary and not exclusive. In some instances it may be useful to provide a color filter 808 over the line scan camera 806 so that only a select range of wavelengths are detected. This can reduce dilution resulting from light emission from micro LED devices of different colors.

Referring now to FIG. 8B, an embodiment is illustrated for scanning a substrate 201, 102 after bonding of the array of micro LED devices. In such an embodiment, the exemplary substrate is approximately 100 mm wide, and a line scan camera with line scan width of approximately 20 mm is provided. As illustrated, the substrate 201, 102 can be scanned using a total of 3 passes to cover the entire surface of the substrate 201, 102. In one embodiment, the line scan camera 806 is a multi-color camera and is capable of simultaneously imaging all of the red, green, and blue micro LED devices 400 assuming the light source(s) 804 provide the required excitation wavelengths to excite all of the micro LED devices. In another embodiment, only a single excitation wavelength or range is provided to target a specific micro LED device emission color. In such an embodiment, it may be required to scan the substrate 201, 102 three separate times, at the three separate excitation wavelengths to image all of the micro LED devices 400. However, at line scan speeds of up to several meters per second, the practical difference in time required for multiple scans may be inconsequential.

In an embodiment, substrate 201, 102 is scanned using a stepped image capture method. For example, the camera is moved a known distance between subpixels, or moved a known distance between the known bonding sites of the micro LED devices between image capture. In such an embodiment, the camera can be a line scan camera. In an embodiment, the camera can be a camera including an x-y array of pixels to capture mosaics or selected tiles. Stepped image capture operation of the camera allows for testing flexibility for specific regions of the substrate surface, and may be particularly suitable for comparing measured spaced apart micro LED devices to nominal patterns. Accordingly, the camera can be moved in a pattern to capture specific locations rather than scanning in a line.

A number of possible processing variations can follow based upon the results of the integrated detection test described with regard to FIGS. 8A-8B. Specifically, in some embodiments, the patterning of passivation layer 148 and top electrode layer 118 can be tailored to the specific results, particularly when deposited by ink jet printing.

FIG. 9 is a cross-sectional side view illustration of an exemplary structure that can be formed after detection of a defective or contaminated micro LED device 400X, in accordance with an embodiment of the invention. In the embodiment illustrated, micro LED device 400 was found functional (e.g. proper emission) in a detection test, and micro LED device 400X was found defective. Alternatively, or in addition, a detection test indicated that micro LED device 400X was contaminated (e.g. particle on top surface could prevent obtaining contact with top electrode layer). Since the defect detection test does not necessarily determine what the defect is, in the embodiment illustrated, the passivation layer 148 may simply be formed over the micro LED device 400X to fully passivate the micro LED device 400X so that it is not possible for the top electrode layer 118 to make electrical contact with the defective or contaminated micro LED device 400X.

FIG. 10 is a cross-sectional side view illustration of an exemplary structure that can be formed after detection of a missing micro LED device, in accordance with an embodiment of the invention. In the embodiment illustrated, the detection test indicated that a micro LED device was not transferred. As a result, passivation layer 118 is formed over the bonding layer 140 to that it is not possible for the top electrode layer 118 to make electrical contact with the bottom electrode 142.

Figure 11:
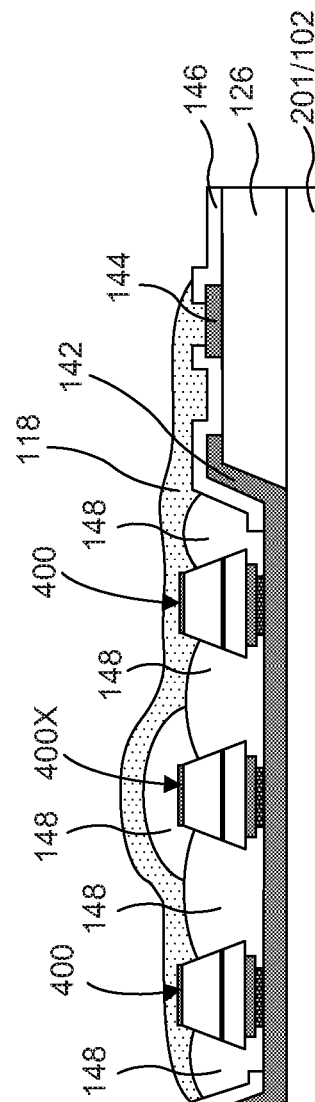
FIG. 11 is a cross-sectional side view illustration of an exemplary structure that can be formed after detection of a defective micro LED device in accordance with an embodiment of the invention

FIG. 11 is a cross-sectional side view illustration of an exemplary structure that can be formed after detection of a defective or contaminated micro LED device 400X, in accordance with an embodiment of the invention. As illustrated, prior to forming the passivation layer 148, a replacement micro LED device 400 can be bonded to the previously open repair bonding site 401 on the bottom electrode 142. As previously described, the repair bonding site 401 may be a bare surface on the bottom electrode layer 142, or alternatively may include a bonding layer 140. Following placement of the replacement micro LED device 400, the passivation layer 148 may be formed to passivate the quantum well structures of the micro LED devices 400, bottom electrode 142, and optionally the exposed surfaces of the defective or contaminated micro LED device 400X as described above with regard to FIG. 9. Top electrode 118 may then be formed to make electrical contact with the micro LED device 400 and replacement micro LED device 400.

Figure 12:
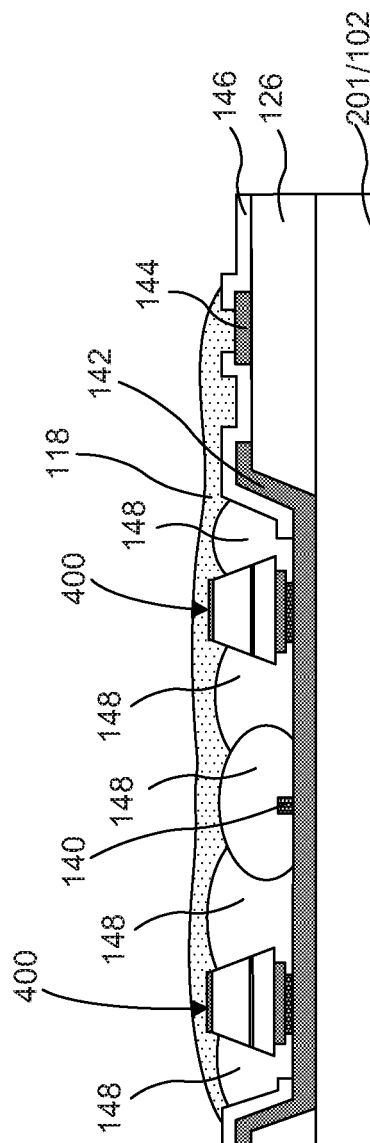
FIG. 12 is a cross-sectional side view illustration of an exemplary structure that can be formed after detection of a missing micro LED device in accordance with an embodiment of the invention.

FIG. 12 is a cross-sectional side view illustration of an exemplary structure that can be formed after detection of a missing micro LED device, in accordance with an embodiment of the invention. As illustrated, prior to forming the passivation layer 148, a replacement micro LED device 400 can be bonded to the previously open repair bonding site 401 on the bottom electrode 142. Following placement of the replacement micro LED device 400, the passivation layer 148 may be formed over the bonding layer 140 to that it is not possible for the top electrode layer 118 to make electrical contact with the bottom electrode 142. Top electrode 118 may then be formed to make electrical contact with the micro LED device 400 and replacement micro LED device 400.

Figure 13:
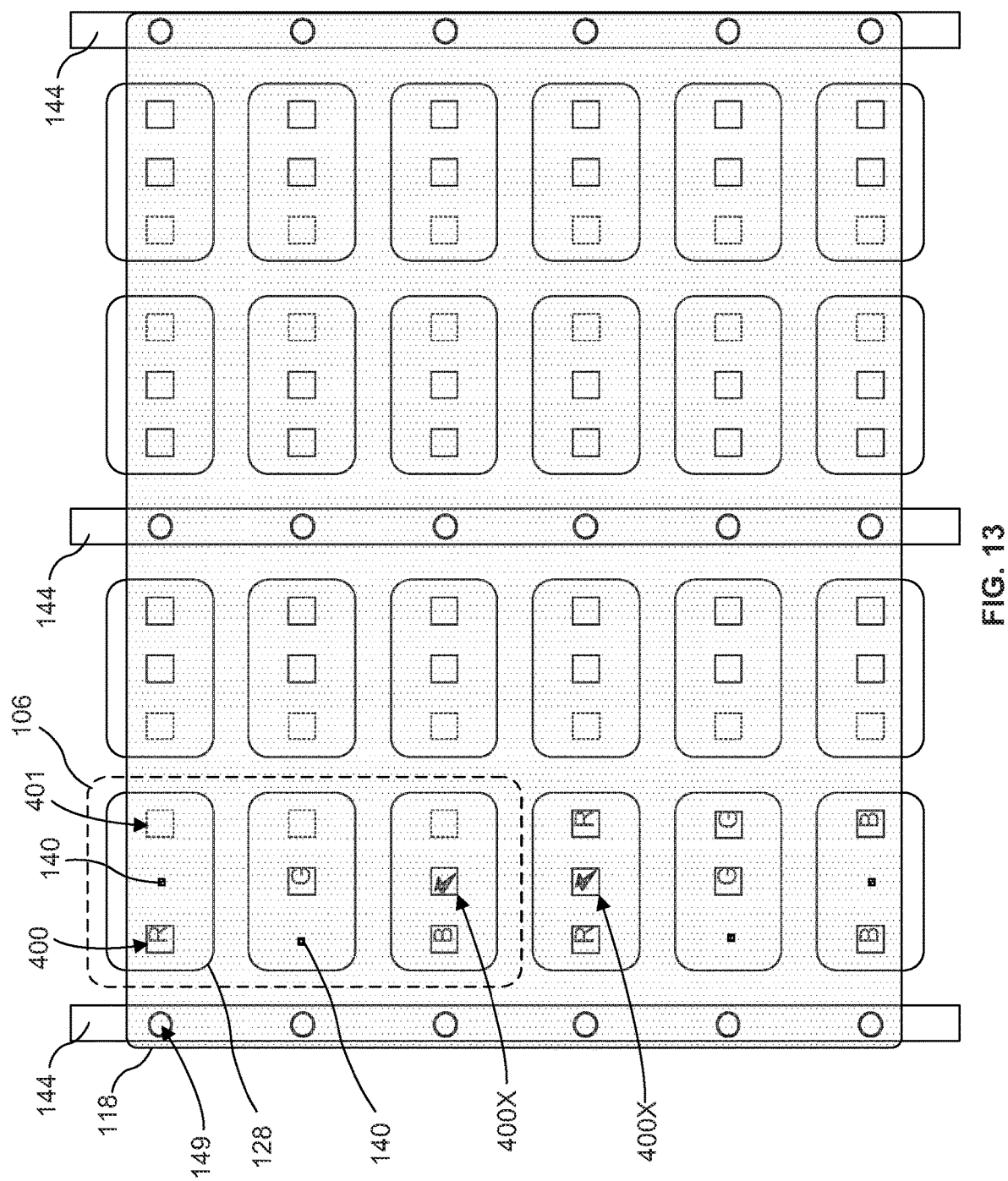
FIG. 13 is a top schematic view illustration of a top electrode layer formed over an array of micro LED devices including a variety of configurations in accordance with an embodiment of the invention.

FIG. 13 is a top schematic view illustration of an array of micro LED devices including a variety of configurations described in FIGS. 9-12 in accordance with embodiments of the invention. In the particular embodiments illustrated in FIG. 13, a top electrode layer 118 is formed over a plurality of bank openings 128, and may be formed over a plurality of subpixels or pixels 106. In an embodiment, the top electrode layer 118 is formed over all of the micro LED devices 400 in the pixel area.

The embodiment illustrated in FIG. 9 is also illustrated as one of the blue-emitting subpixels in FIG. 13 where the top electrode layer 118 is formed over both the blue emitting micro LED device 400, and the defective or contaminated micro LED device 400X, where the defective or contaminated micro LED device 400X is covered with the passivation layer 148.

The embodiment illustrated in FIG. 10 is also illustrated as one of the red-emitting subpixels in FIG. 13 where the top electrode layer 118 is formed over both the red-emitting micro LED device 400, and the bonding layer 140, where the bonding layer 140 is covered with the passivation layer 148.

The embodiment illustrated in FIG. 11 is also illustrated as one of the red-emitting subpixels in FIG. 13 in which a replacement red-emitting micro LED device 400 is bonded to the previously open repair bonding site 401. As previously described, the open repair bonding site 401 may have been a bare surface on the bottom electrode layer 142, or alternatively may have included a bonding layer 140. Similar to FIG. 9, the top electrode layer 118 is formed over both the red-emitting micro LED devices 400, and the defective or contaminated micro LED device 400X, where the defective or contaminated micro LED device 400X is covered with the passivation layer 148.

The embodiment illustrated in FIG. 12 is also illustrated as one of the blue-emitting subpixels in FIG. 13 in which a replacement blue-emitting micro LED device 400 is bonded to the previously open repair bonding site 401. Similar to FIG. 10, the top electrode layer 118 is formed over both the blue-emitting micro LED devices 400, and the bonding layer 140, where the bonding layer 140 is covered with the passivation layer 148.

Figure 14:
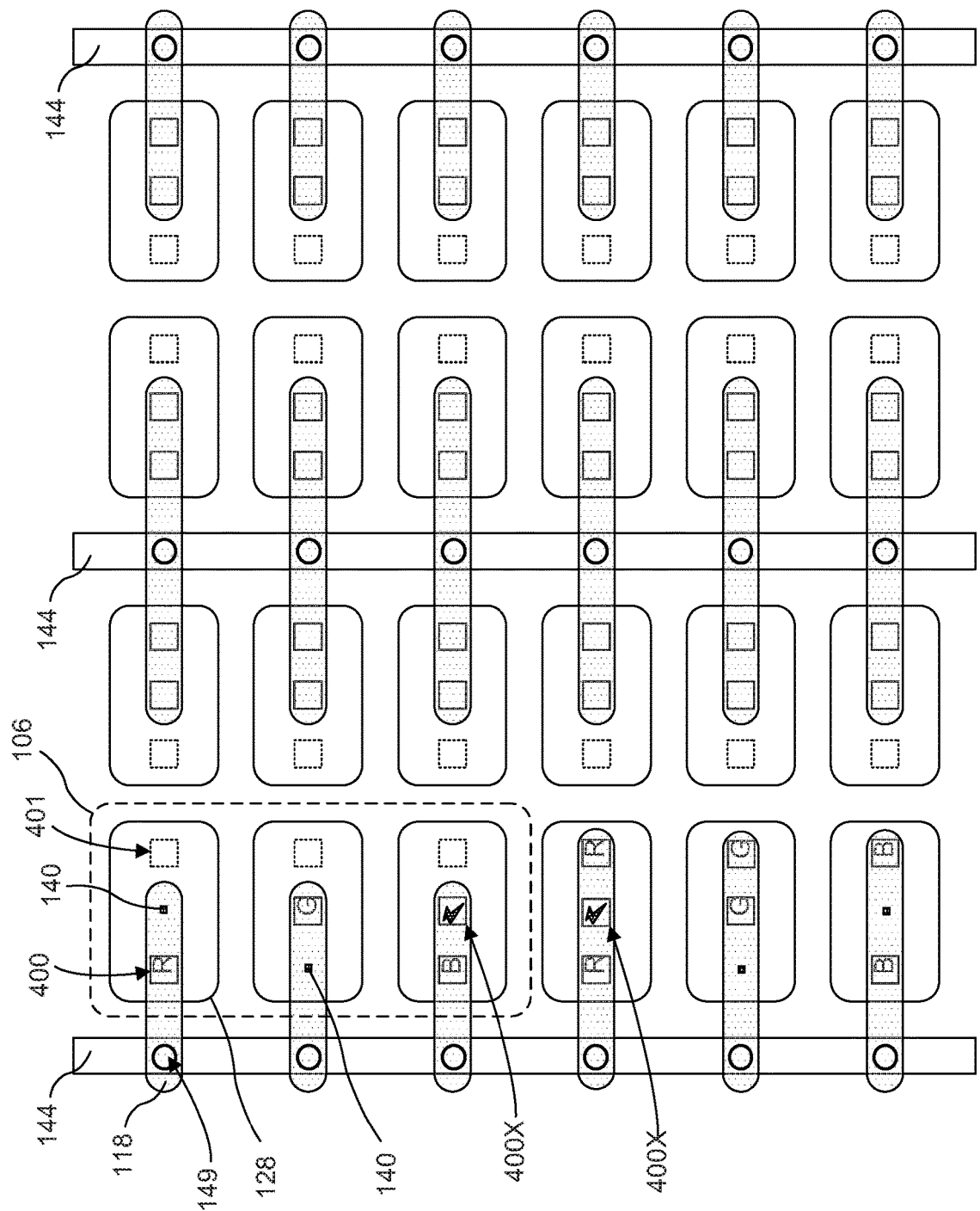
FIG. 14 is a top schematic view illustration of a plurality of separate top electrode layers formed over an array of micro LED devices including a variety of configurations in accordance with an embodiment of the invention.

FIG. 14 is a top schematic view illustration of an array of micro LED devices including a variety of configurations described in FIGS. 9-12 in accordance with embodiments of the invention. In the particular embodiments illustrated in FIG. 13, the arrangements of micro LED devices 400 are the same as those described above with regard to FIG. 13. The embodiments illustrated in FIG. 14 differ from those illustrated in FIG. 13 particularly in formation of a plurality of separate top electrode layers 118. In one embodiment, such as those illustrated in the labeled pixel 106 where a micro LED device 400 is not placed on the repair bonding site 401, it is not required for the top electrode layers 118 to be formed thereon. Accordingly, the length of the top electrode layer 118 can be determined based upon whether or not a replacement micro LED device is added. In addition, the blue-emitting subpixel in the labeled pixel 106 shows a defective or contaminated micro LED device 400X on the bonding site further away from the ground tie line. In such an embodiment, the top electrode layer 118 may be formed over only the blue-emitting micro LED device 400, or over both the blue-emitting micro LED device 400 and the defective or contaminated micro LED device 400X. The top electrode layer 118 may also be formed over the bonding site 401.

Figure 15:
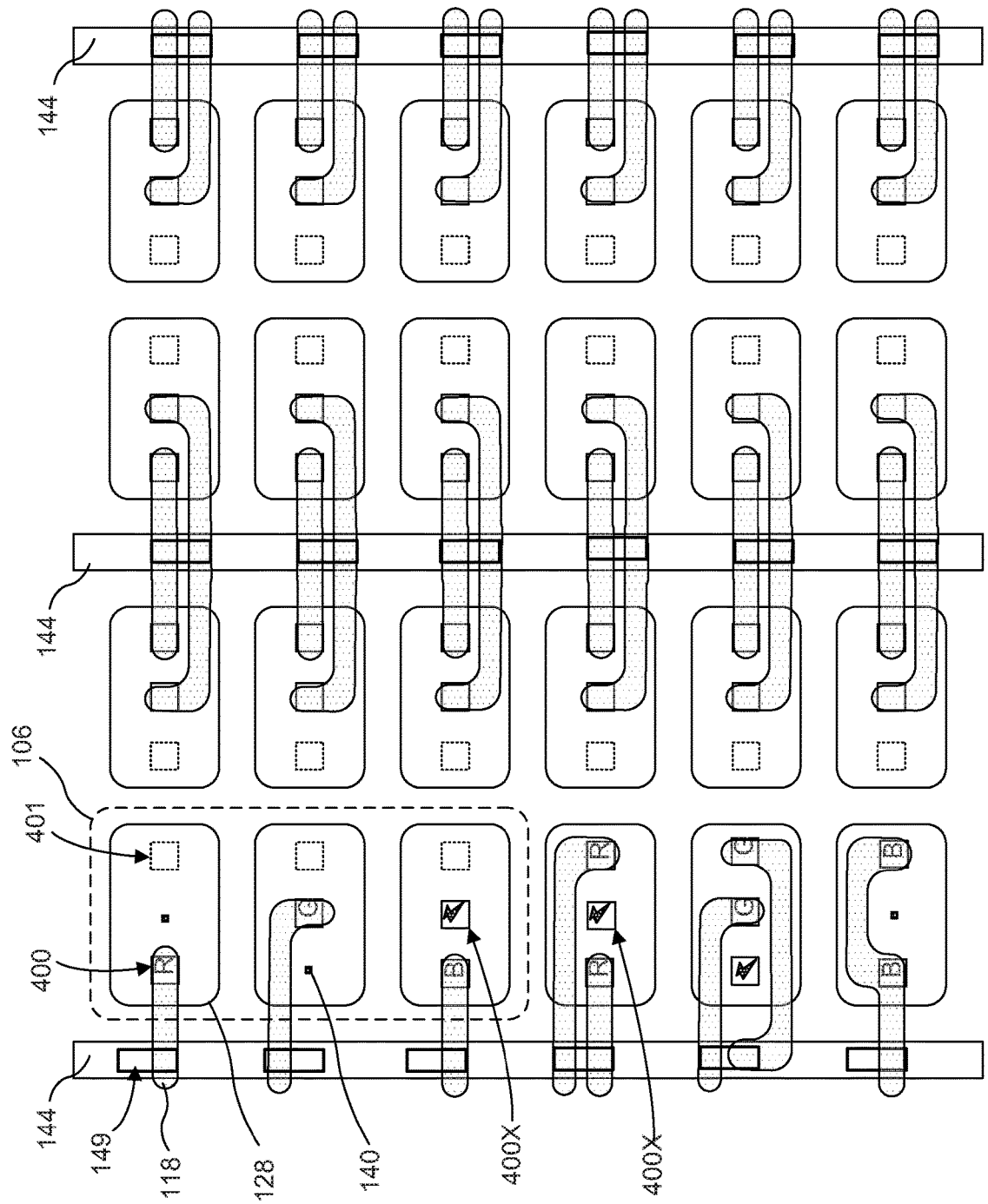
FIG. 15 is a top schematic view illustration of a plurality of separate top electrode layers formed over an array of micro LED devices including a variety of configurations in accordance with an embodiment of the invention.

FIG. 15 is a top schematic view illustration of an array of micro LED devices including a variety of configurations described in FIGS. 9-12 in accordance with embodiments of the invention. In the particular embodiments illustrated in FIG. 15, the arrangements of micro LED devices 400 are the same as those described above with regard to FIGS. 13-14. The embodiments illustrated in FIG. 15 differ from those illustrated in FIG. 14 particularly in formation of the plurality of separate top electrode layers 118. The embodiments illustrated in FIG. 14 were shown as altering the length of the top electrode layers 118, while the embodiments illustrated in FIG. 15 are shown as altering the path of the top electrode layers 118, and/or number of top electrode layers 118. For example, in many of the embodiments illustrated in FIG. 15, a separate top electrode layer 118 can be formed for every micro LED device 400. In the embodiment illustrated in the bottom-most blue-emitting subpixel, a single top electrode layer 118 can be formed for multiple micro LED devices 400 where the path is adjusted to avoid a bonding layer 140, or alternatively a defective or contaminated micro LED device. In this manner, adjusting the path of the top electrode layers 118 can be used in the alternative to, or in addition to, adjusting deposition of the passivation layer 148 to cover defective or contaminated micro LED devices or the bonding sites of missing micro LED devices.

Figure 16:
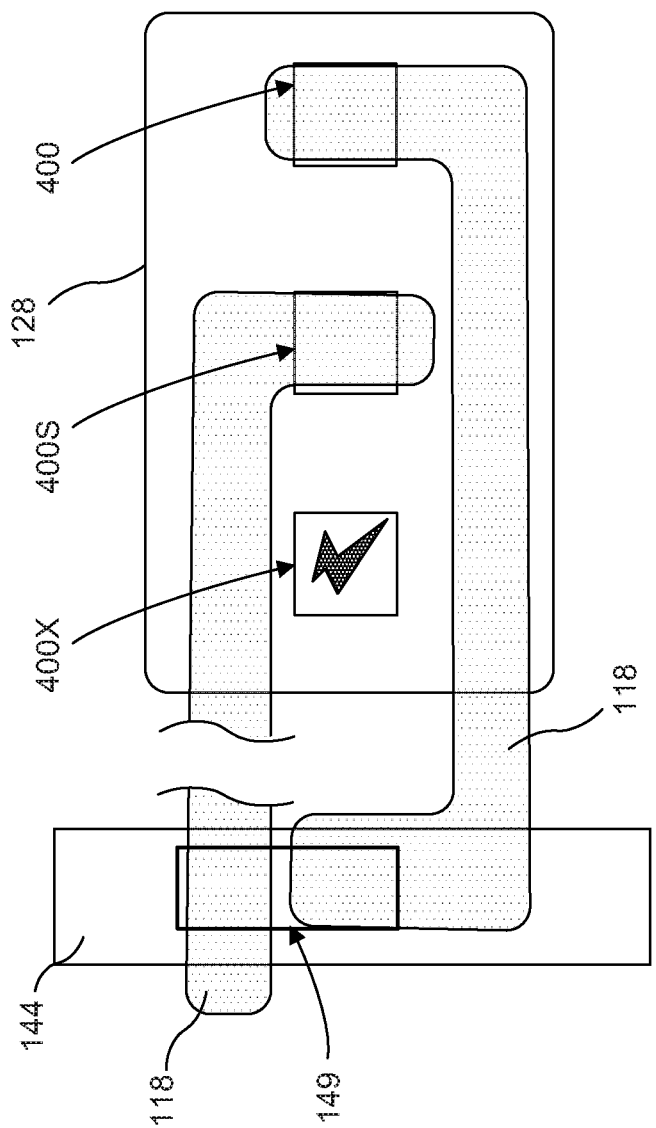
FIG. 16 is a top schematic view illustration of a scribed top electrode layer in accordance with an embodiment of the invention.

The formation of separate top electrode layer(s) 118 may provide an additional benefit during electrical testing of the panel 100 after formation of the top electrode layer(s) 118. For example, prior to formation of the top electrode layer 118 it may not have been possible to detect certain defects resulting in shorting of a micro LED device 400S. The implication of a shorted micro LED device 400S could result in a dark subpixel in which all of the current flows through the shorted micro LED devices 400S rather than any of the other micro LED devices in the subpixel. In the embodiment illustrated in FIG. 16 the top electrode layer 118 connected to a shorted micro LED device 400S is cut using a suitable technique such as laser scribing. In this manner, electrical shorts that could not have been or were not detected during the integrated testing method previously described could potentially be detected during an electrical test with the application of electrical current through the display after formation of the top electrode layer 118. In such an embodiment, if a micro LED device 400S is shorted, the top electrode layer 118 to the micro LED device 400S can be cut, allowing the redundant and/or repair micro LED device to provide the emission from the subpixel.

Figure 17:
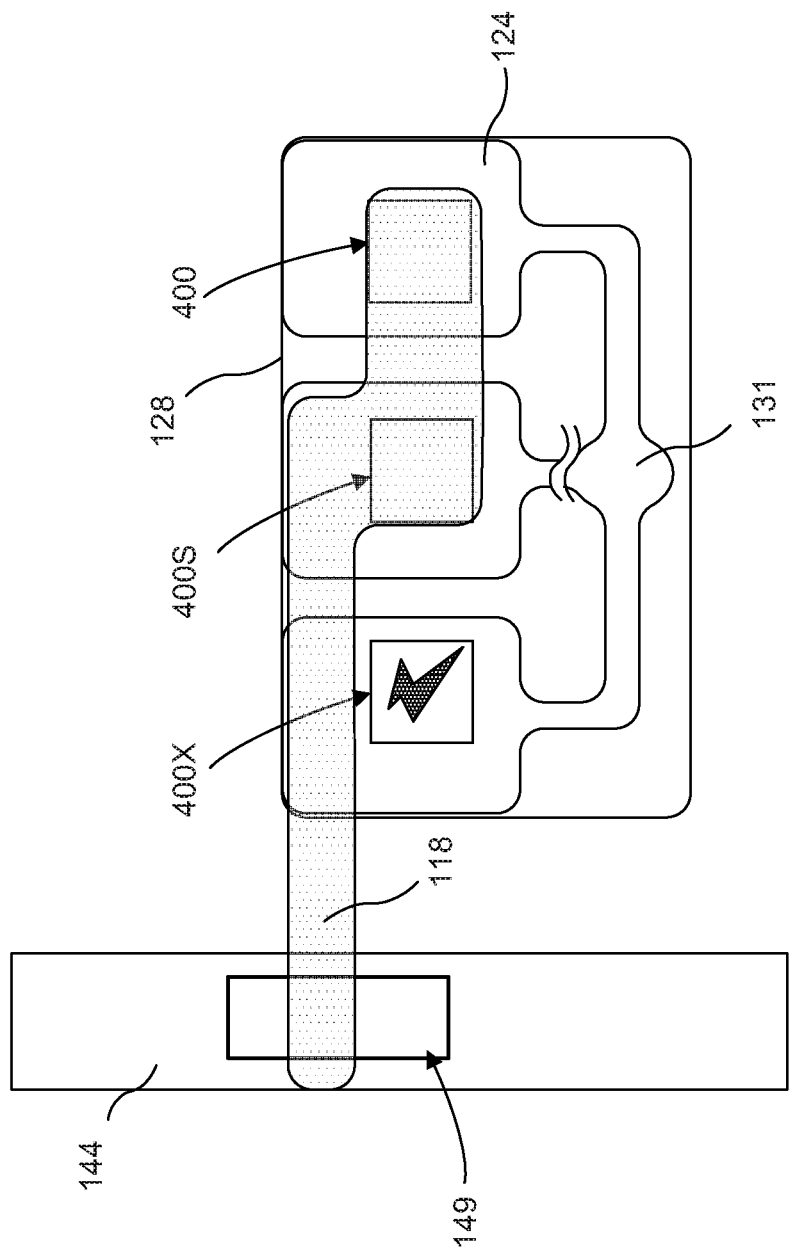
FIG. 17 is a top schematic view illustration of a scribed bottom electrode layer in accordance with an embodiment of the invention.

FIG. 17 illustrates an alternative embodiment where rather that cutting or scribing the top electrode layer 118, the bottom electrode layer 124 can be cut using a suitable technique such as laser scribing to segregate irregular micro LED devices. In the particular embodiment illustrated, the bottom electrode layer 124 includes separate landing areas for the micro LED devices. In the particular embodiment illustrated, the bottom electrode 124 landing area supporting the micro LED device 400S is cut using a suitable technique such as laser scribing to segregate the irregular micro LED device so that it is not in electrical communication with the underlying TFT circuitry through filled opening 131.

Figure 18:
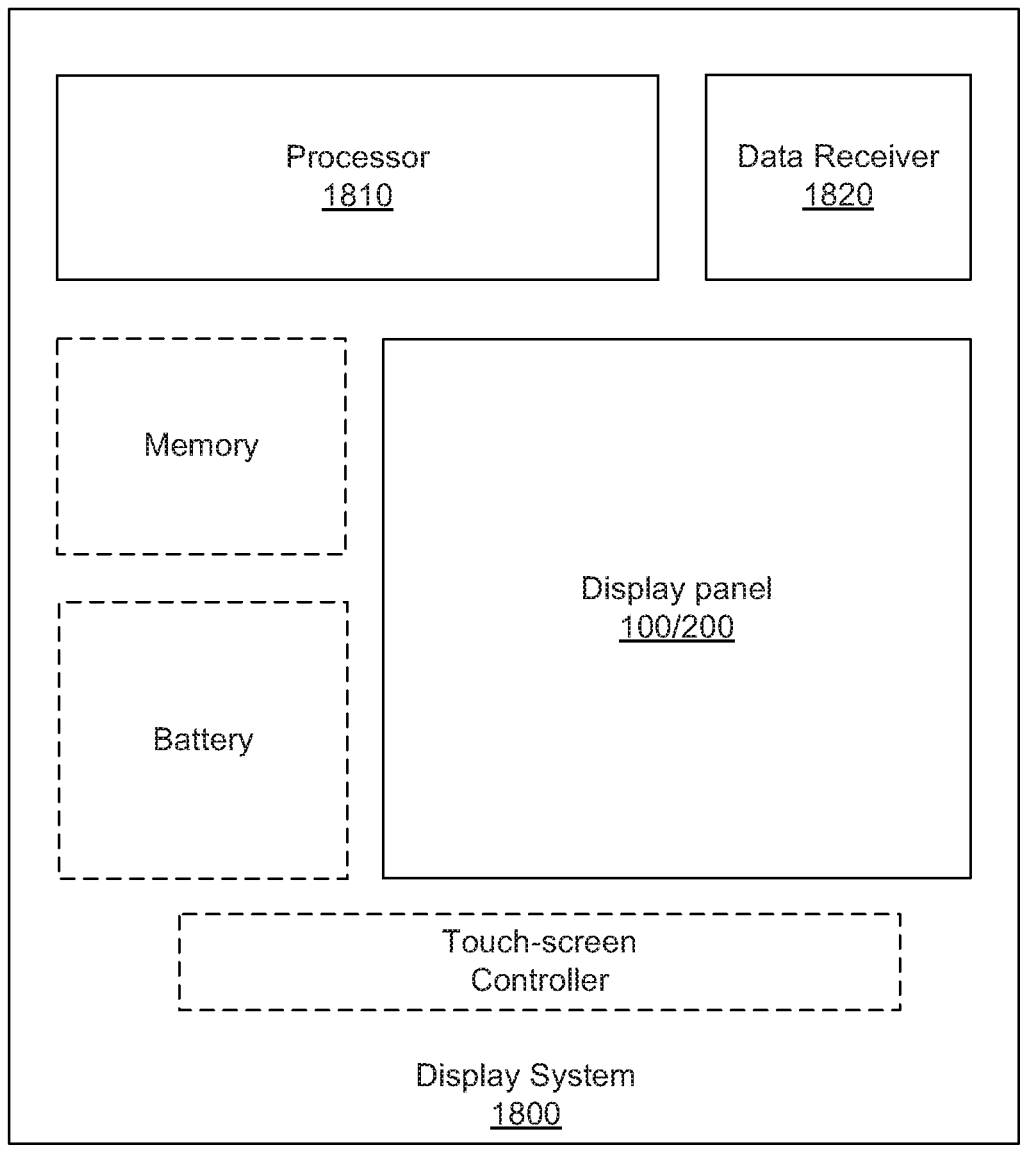
FIG. 18 is a schematic illustration of a display system in accordance with an embodiment of the invention.

FIG. 18 illustrates a display system 1800 in accordance with an embodiment. The display system houses a processor 1810, data receiver 1820, a display panel 100, 200, such as any of the display panels described above. The data receiver 1820 may be configured to receive data wirelessly or wired. Wireless may be implemented in any of a number of wireless standards or protocols including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Depending on its applications, the display system 1800 may include other components. These other components include, but are not limited to, memory, a touch-screen controller, and a battery. In various implementations, the display system 1800 may be a television, tablet, phone, laptop, computer monitor, kiosk, digital camera, handheld game console, media display, ebook display, or large area signage display.

In utilizing the various aspects of this invention, it would become apparent to one skilled in the art that combinations or variations of the above embodiments are possible for integrating a redundancy scheme and repair site into an active matrix display panel, as well as integrating a testing method for detecting irregularities in the array of micro LED devices such as missing, defective, or contaminated micro LED devices.

While the above embodiments have been described with regard to active matrix display panels, the redundancy scheme, repair site, and testing method for detecting missing, defective, or contaminated micro LED device can also be implemented into passive matrix display panels, as well as substrates for lighting purposes. In addition, while the above embodiments have been described with regard to a top emission structure, embodiments of the invention are also applicable to bottom emission structures. Similarly, while top gate transistor structures have been described, embodiments of the invention may also be practiced with bottom gate transistor structures. Furthermore, while embodiments of the invention have been described and illustrated with regard to a high side drive configuration, embodiments may also be practiced with a low side drive configuration in which the ground tie lines and ground ring described above become the power line in the panel. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:
1. A display panel with redundancy scheme comprising:
 an array of micro LED devices arranged in an array of redundant micro LED device pairs in array of pixels, each pixel of the array of pixels including a first subpixel, a second subpixel and a third subpixel;

each first subpixel including a first redundant micro LED device pair designed to emit a first primary color emission;

each second subpixel including a second redundant micro LED device pair designed to emit a second primary color emission;

each third subpixel including a third redundant micro LED device pair designed to emit a third primary color emission;

wherein the first, second and third primary color emissions are different from one another; and wherein each micro LED device of the array of micro LED devices is a separate device that has a maximum width of 1 to 100 µm and comprises a p-n diode, a top conductive contact, and a bottom conductive contact that is bonded to a display substrate with a corresponding separate solder material.

2. The display panel of claim 1, wherein the display panel further comprises an array of micro controller chips to drive the array of micro LED devices.

3. The display panel of claim 2, wherein each micro LED device has a maximum width of 1 to 30 µm.

4. The display panel of claim 2, wherein each micro LED device has a maximum width of 1 to 10 µm.

5. The display panel of claim 2, further comprising a plurality of top electrode layers in electrical contact with the array of redundant micro LED device pairs.

6. The display panel of claim 5, further comprising separate top electrode layers connected the redundant micro LED device pairs for each subpixel.

7. The display panel of claim 5, further comprising a plurality of Vss tie lines within the display substrate.

8. The display panel of claim 7, further comprising a planarization layer formed over the plurality of Vss tie lines.

9. The display panel of claim 8, wherein the plurality of top electrode layers is in electrical connection with the plurality of Vss tie lines.

10. The display panel of claim 9, further comprising a passivation layer material covering sidewalls of the array of redundant micro LED device pairs, and the plurality of top electrode layers span over a top surface of the passivation layer material.

11. The display panel of claim 10, wherein each micro LED device comprises a bottom bonding layer that is diffused with the corresponding separate solder material.

12. The display panel of claim 10, further comprising a plurality of power supply lines coupled to the plurality of micro controller chips.

13. The display panel of claim 12, wherein the first redundant micro LED device pair is designed to emit a red primary color emission, the second redundant micro LED device pair is designed to emit a green primary color emission, and the third redundant micro LED device pair is designed to emit a blue primary color emission.

14. The display panel of claim 2, wherein the display panel comprises a plurality of Vss tie lines within the display substrate.

15. The display panel of claim 14, wherein the display substrate is flexible.

16. The display panel of claim 15, further comprising separate top electrode layers connected the redundant micro LED device pairs for each subpixel.

17. The display panel of claim 16, wherein the plurality of top electrode layers is in electrical connection with the plurality of Vss tie lines.

* * * * *